(12) United States Patent
Nakai

(10) Patent No.: US 11,016,843 B2
(45) Date of Patent: May 25, 2021

(54) DIRECT-INPUT REDUNDANCY SCHEME WITH ADAPTIVE SYNDROME DECODER

(71) Applicant: Micron Technology, Inc., Boise, ID (US)

(72) Inventor: Kiyoshi Nakai, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 189 days.

(21) Appl. No.: 16/212,017

(22) Filed: Dec. 6, 2018

(65) Prior Publication Data

US 2020/0183782 A1 Jun. 11, 2020

(51) Int. Cl.
*G11C 29/00* (2006.01)
*G06F 11/10* (2006.01)
*H03M 13/45* (2006.01)
*G11C 29/52* (2006.01)

(52) U.S. Cl.
CPC .......... *G06F 11/1068* (2013.01); *G11C 29/52* (2013.01); *H03M 13/45* (2013.01)

(58) Field of Classification Search
CPC ..... G06F 11/1068; G11C 29/52; H03M 13/45
USPC ....... 714/718, 751, 752, 753, 755, 757, 568, 714/763, 764, 766, 769, 770, 772, 773
See application file for complete search history.

(56) References Cited

U.S. PATENT DOCUMENTS

| | | |
|---|---|---|
| 2004/0210814 A1 | 10/2004 | Cargnoni et al. |
| 2005/0240838 A1 | 10/2005 | Iwai |
| 2010/0211853 A1 | 8/2010 | Madan et al. |
| 2016/0085464 A1* | 3/2016 | Tuers ...................... G06F 3/064 714/704 |
| 2017/0083401 A1 | 3/2017 | Ryu et al. |
| 2019/0229753 A1* | 7/2019 | Cha ..................... G06F 11/1012 |
| 2020/0104205 A1* | 4/2020 | Noguchi ............... G06F 11/102 |

FOREIGN PATENT DOCUMENTS

KR 1019960042764 12/1996

OTHER PUBLICATIONS

ISA/KR, International Search Report and Written Opinion of the International Searching Authority, Int'l Appl. No. PCT/US2019/063393, dated Mar. 16, 2020, Korean Intellectual Property Office, Seo-gu, Daejeon, Republic of Korea, 9 pgs.

* cited by examiner

*Primary Examiner* — Christine T. Tu
(74) *Attorney, Agent, or Firm* — Holland & Hart LLP

(57) ABSTRACT

Methods, systems, and devices for operating memory cell(s) using a direct-input column redundancy scheme are described. A device that has read data from data planes may replace data from one of the planes with redundancy data from a data plane storing redundancy data. The device may then provide the redundancy data to an error correction circuit coupled with the data plane that stored the redundancy data. An output of the error correction circuit may be used to generate syndrome bits, which may be decoded by a syndrome decoder. The syndrome decoder may indicate whether a bit of the data should be corrected by selectively reacting to inputs based on the type of data to be corrected. For example, the syndrome decoder may react to a first set of inputs if the data bit to be corrected is a regular data bit, and react to a second set of inputs if the data bit to be corrected is a redundant data bit.

8 Claims, 14 Drawing Sheets

DIRECT-INPUT REDUNDANCY SCHEME WITH ADAPTIVE SYNDROME DECODER

BACKGROUND

The following relates generally to operating a memory array and more specifically to a direct-input redundancy scheme with adaptive syndrome decoder.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may perform a read operation to sense the stored state in the memory device. To store information, a component of the electronic device may perform write operation to program the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM, PCM, RRAM) may maintain their stored logic state for extended periods of time even in the absence of an external power source. Volatile memory devices (e.g., DRAM) may lose their stored state over time unless they are periodically refreshed by an external power source.

During a retrieval operation, a memory device may read and perform error correction on data bits stored in memory. Before error correction, the device may replace some of the data bits with substitute data bits, which may be referred to as redundant data bits. But the data path between the memory location of the redundant bits and the error correction circuitry may add unnecessary and costly delay into the error correction operation, which may increase the latency of the retrieval operation, among other disadvantages.

DETAILED DESCRIPTION

Figure 1:
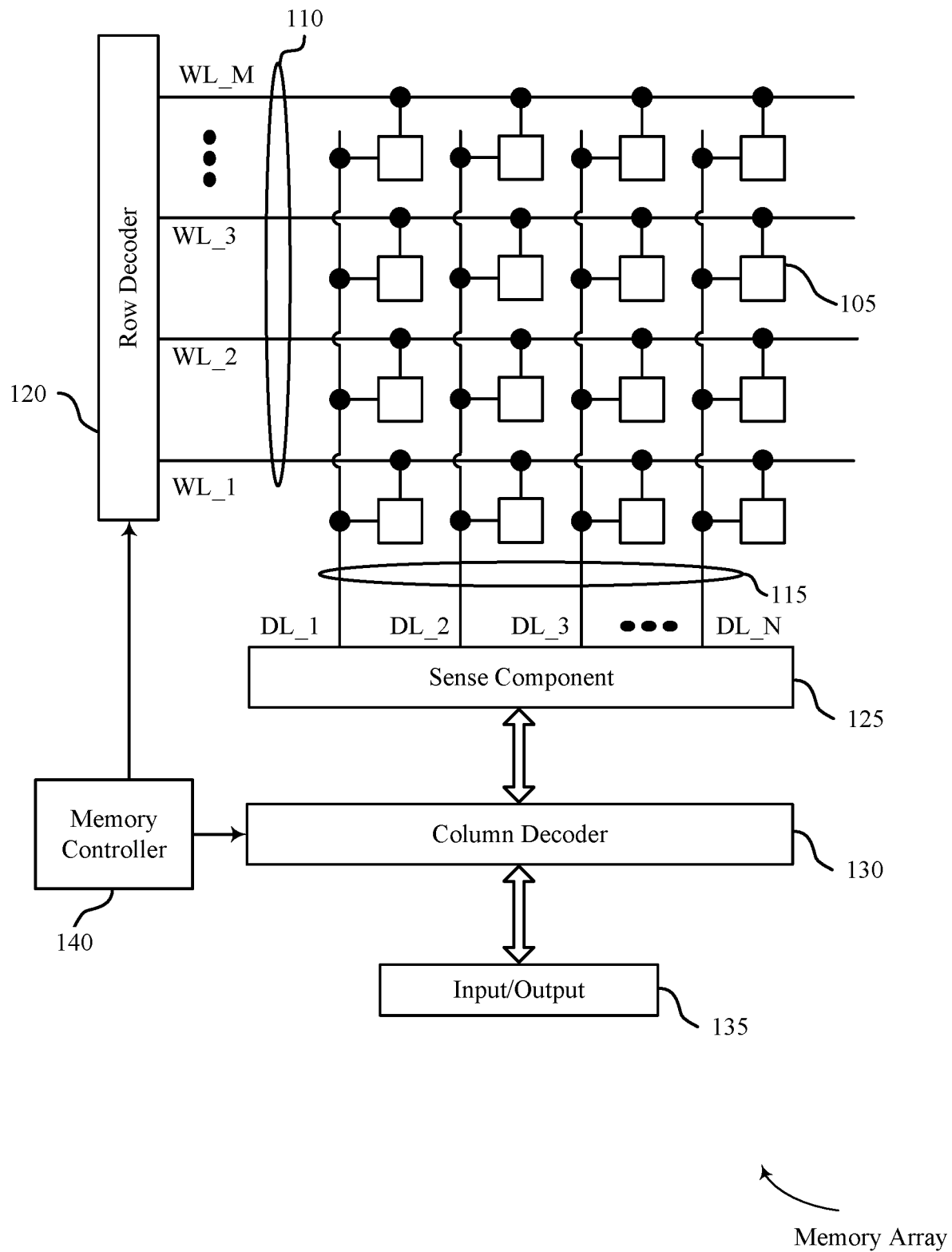
FIG. 1 illustrates an example memory array that supports a direct-input redundancy scheme with a dedicated ECC circuit in accordance with various embodiments of the present disclosure.

A memory device may increase the reliability of stored data bits by performing error correction (e.g., using an error correction code (ECC)) on the data bits during a retrieval operation. In some cases, the memory device may further increase reliability by replacing some of the data bits with substitute bits, which may be referred to as redundant data bits. For example, the device may replace the data bits from one of the data planes implicated in the read operation with redundant data bits stored at a redundant data plane. But transferring the redundant data to the error correction circuitry for the replaced data plane may increase the latency of the error correction operation, which latency may be proportional to the length of the data path along which the redundant data travels to the error correction circuitry.

According to a first technique described herein, a memory device may reduce the length of the data path—and consequently the propagation delay—by directly inputting redundancy data bits into an error correction circuit dedicated to the redundant data plane. The error correction circuit may be coupled with adaptive enablement circuitry that may selectively transfer an output of the error correction circuit to other error correction components based on the data plane replaced by the redundant data. For example, the enablement circuitry may transfer an output of the error correction circuit to one combination of error correction components when the redundant data is for an xth data plane, but may transfer the output of the error correction circuit to a different combination of error correction components when the redundant data is for a yth data plane. Thus, the error correction components may operate without interference even though the redundant data was passed directly to the error correction circuit for the redundant data plane (and not the error correction circuit for the replaced data plane).

Features of the first technique are further described herein in the context of a memory system. Specific examples of devices and methods are described for directly inputting redundant data into an error correction circuit dedicated to redundancy data. These and other features of the disclosure are further illustrated by and described with reference to apparatus diagrams, system diagrams, and flowcharts that relate to generating syndrome bits for a codeword that includes redundant data.

According to a second technique described herein, a memory device may reduce the length of the data path—and consequently the propagation delay—by directly inputting redundancy data bits into error correction circuitry dedicated to the redundant data plane. The error correction circuitry for the redundant data may perform operations on the redundant data that contribute to the generation of syndrome bits for the read data bits. Once the syndrome bits are generated, the device may decode the syndrome bits using an adaptive syndrome decoder. The syndrome decoder may be adaptive in that it selectively reacts to inputs based on the type of data being decoded (e.g., redundant data versus regular data). For example, the syndrome decoder may react to a first set of inputs, but may essentially ignore a second set of inputs, when the data being decoded is redundant data. The output of the syndrome decoder may indicate to a bit flipping circuit whether a data bit (e.g., either a regular data bit or a redundant data bit) is incorrect and should be flipped (e.g., inverted).

Features of the second technique are further described herein in the context of a memory system. Specific examples of devices and methods are described for directly inputting redundant data into error correction circuitry. These and other features of the disclosure are further illustrated by and described with reference to apparatus diagrams, system diagrams, and flowcharts that relate to an adaptive syndrome decoder.

FIG. 1 illustrates an example memory array 100 that supports a direct-input redundancy scheme with a dedicated ECC circuit in accordance with various embodiments of the present disclosure. Memory array 100 may be used to store digital information (e.g., binary information) and may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states.

A memory cell 105 may include a memory element having programmable states. A memory cell 105 in a DRAM or FeRAM architecture may store a charge representative of the programmable states in a capacitor; for example, a charged and uncharged capacitor may represent two logic states, respectively. DRAM architectures may commonly use such a design and may use a capacitor including a dielectric material and having linear electric polarization properties as a memory element. FeRAM architectures may also use such a design, but the capacitor used as the memory element may include a ferroelectric material with non-linear polarization properties. A memory cell 105 in a PCM architecture may change a resistivity (e.g., resistance or threshold voltage) of a material where different resistivity may represent different logic states. PCM architectures may use chalcogenide materials having electronically programmable resistances as memory elements.

Operations such as reading and writing may be performed on memory cells 105 by activating or selecting the appropriate access line 110 and digit line 115. Access lines 110 may also be referred to as word lines 110 and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_3 and DL_N, the memory cell 105 at their intersection may be accessed.

Upon accessing, a memory cell 105 may be read, or sensed, by sense component 125 to determine the stored state of the memory cell 105. For example, after accessing the memory cell 105, the capacitor of memory cell 105 may discharge onto its corresponding digit line 115. Discharging the capacitor may be based on biasing, or applying a voltage, to the capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa.

The reliability of a sensing operation may be dependent on a sensing window that results from reading the memory cell 105. For instance, a larger sensing window may be associated with fewer bit errors than a smaller sensing window. The sensing window may be determined as the difference between a voltage of a digit line 115 resulting from reading a memory cell 105 when storing a logic 1 and a voltage of the digit line 115 resulting from reading the memory cell when storing a logic 0. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed herein, activating a word line 110 electrically connects the corresponding row of memory cells 105 to their respective digit lines 115. By controlling the relevant digit line 115 while the word line 110 is activated, a memory cell 105 may be written—e.g., a logic value may be stored in the memory cell 105. In some cases, a memory array 100 that stores a data bit corresponding to a logic value at a first memory cell 105 may (e.g., for reliability purposes) store another data bit corresponding to the logic state at another memory cell 105. The data bit stored at the second memory cell 105 may be referred to as a redundant data bit. Column decoder 130 may accept data, for example input 135, to be written to the memory cells 105.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, memory array 100 may be partitioned into sets of memory cells. For example, memory array 100 may be partitioned into memory sections called data planes, at least some of which may include multiple memory cells 105. The data planes may be configured so that different sets of data planes may be accessed by different word lines 110. For example, a set of the data planes may be accessed by the same word line 110, which may also be shared with a redundant data plane that is configured to store redundant data bits corresponding to data bits stored by the data planes (e.g., the redundant data bits may be based on the same logic states as the data bits stored at the data planes). The digit lines 115 of the memory cells in each data plane may be coupled with respective error correction circuitry, such as an error correction code (ECC) module.

Before storing data at a set of data planes, memory array 100 may generate a quantity of parity bits for the data for error correction purposes. The parity bits may be based on the data to be stored (e.g., as defined by an error correction code, such as a Hamming code). Once the one or more parity bits are generated, they may be appended to the original data bits and stored along with the original data bits in the set of data planes. The combination of the original data bits and appended parity bits may be referred to herein as a codeword. In certain cases, some of the original data bits intended to be stored at a respective data plane may also be stored at a redundant data plane. For example, a device that has x logic states to store may store data bits corresponding to those x logic states not only within memory cells of a data plane but also within memory cells of a redundant data plane.

When the codeword is read, but before error correction, the redundant set of data bits may replace the original set of bits in a process referred to as redundancy repair. Redundancy repair may increase the reliability of the codeword but also increase the latency of the read operation, particularly when the propagation path for the redundant data is long.

In some examples, information (e.g., one or more codewords) stored in memory array 100 may be requested by another device (e.g., a memory component such as a buffer or an external processor). Upon receiving a request for information, memory array 100 may identify a location of the information within memory array 100 (e.g., memory array 100 may identify the location of one or more codewords within one or more sets of data planes). For example, memory array 100 may determine that the information is located within a set of memory cells that is located within a particular set of data planes. The memory array 100 may access the set of data planes via the associated word line 110 so that the data bits stored by the memory cells, and corresponding parity bits, are output on respective digit lines 115.

Before providing the information to the requesting device, however, memory array 100 may first process the information, performing redundancy repair and error correction for the information bits stored in the set of memory planes. For example, after replacing a fraction of the original data bits with redundant bits, memory array 100 may determine whether any of the bits are in error (e.g., in an inverted state compared to the original stored state) and flip the incorrect bits to return them to the stored state expected by the requesting device.

During error correction (e.g., during an error correction operation), memory array 100 may generate syndrome bits which can be used to detect errors in read data bits and identify the location of those errors. For example, the syndrome bits for a codeword may be compared to the parity bits for the codeword to determine whether the codeword contains an error. If no error is detected (e.g., if the syndrome bits match the parity bits), the data bits may be passed to the requesting device without error correction (e.g., without inverting any of the bits). But if an error is detected (e.g., if the syndrome bits do not match the parity bits), the memory array 100 may decode the syndrome bits to identify the location of the error within the codeword so that the error may be corrected (e.g., inverted) before transferring it to the requesting device.

To perform error correction, the data bits from each data plane involved in the read operation may be input into a respective error correction circuit, which may be positioned near the data plane. When redundancy repair is used for the bits in a data plane, the redundant data bits, rather than the original data bits, may be input into the error correction circuit for that data plane (or at least undergo an operation comparable to that performed by the error correction circuit for that data plane). But the delivery of the redundant bits to the proper error correction circuit (e.g., the error correction circuit for the data plane to be replaced) may be associated with a propagation delay—e.g., due to the propagation path from the redundant data plane to the error correction circuit. According to the techniques described herein, the propagation path for redundant data may be reduced, compared to other architectures, by inputting the redundant data into an additional error correction circuit disposed near the redundant data plane. The additional error correction circuit may replicate the output of the error correction circuit for the data plane to be replaced, thereby ensuring that the error correction operation is undisturbed.

Figure 2:
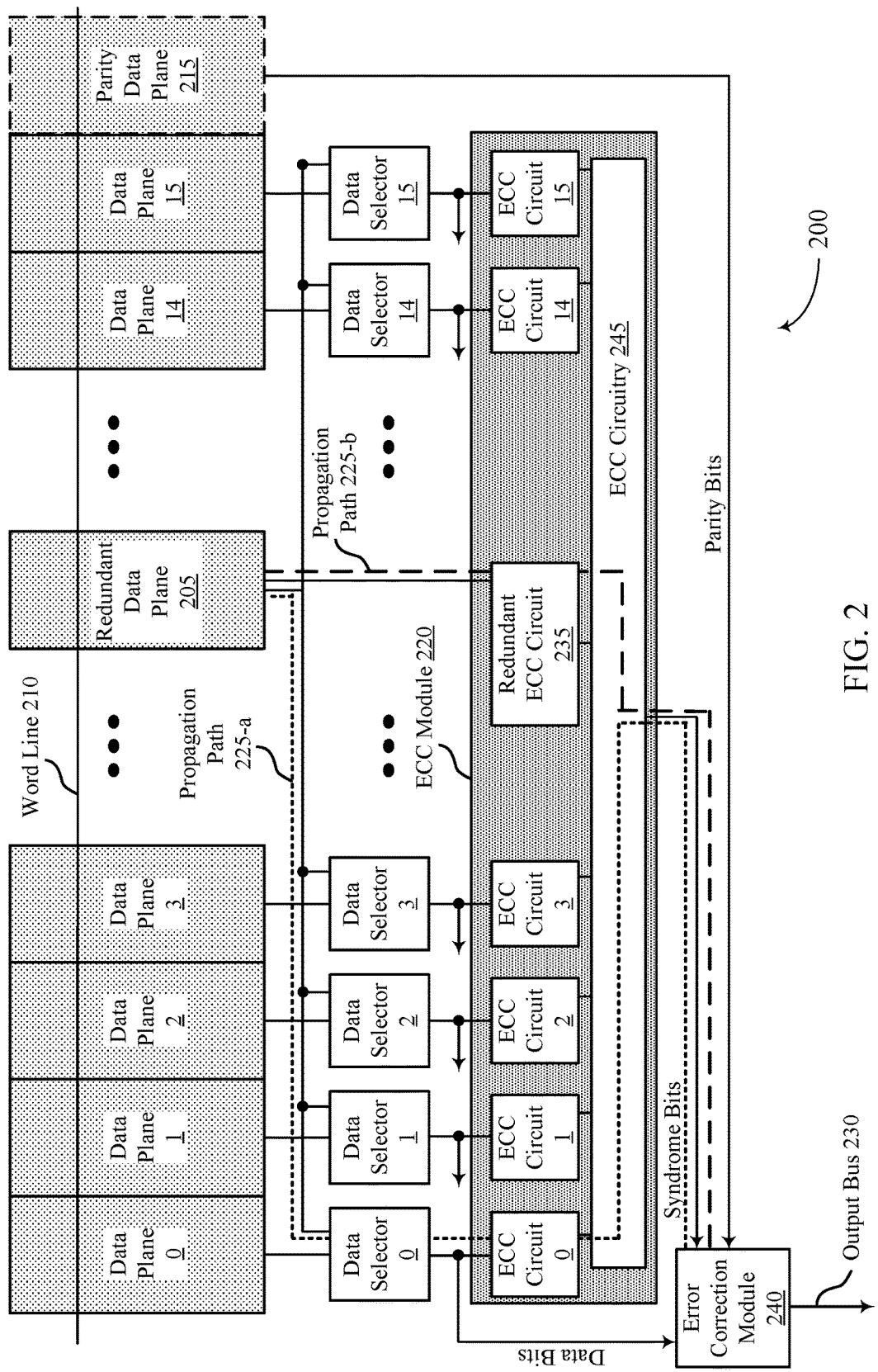
FIG. 2 illustrates an example of a memory architecture that supports a direct-input redundancy scheme with a dedicated ECC circuit in accordance with various embodiments of the present disclosure.

FIG. 2 illustrates an example of a memory architecture 200 that supports a direct-input redundancy scheme with a dedicated ECC circuit in accordance with various embodiments of the present disclosure. Memory architecture 200 may support a column redundancy scheme in which redundant data for a data plane is stored at a separate data plane (or "column") reserved for redundant data. For example, in a column redundancy scheme, redundant data corresponding to data in data plane 0 may be stored at redundant data plane 205.

Redundant data plane 205 may include multiple memory cells and may have the capacity to store redundant data for (e.g., corresponding to) multiple data planes. For example, redundant data plane 205 may be part of a global column redundancy architecture in which the redundant data plane 205 is configured to store redundancy data for any or all of the data planes accessed by the same word line as the redundant data plane 205. A data plane that does not store redundant data may be referred to herein as a regular data plane or a non-redundant data plane. Redundant data may be data that represents the logics states that serve as a basis for data bits stored in a regular data plane. Thus, when the data bits in a regular data plane are uncorrupted, the redundant data bits corresponding to those data bits may be the same as those data bits. However, if the data bits in the regular data plane are corrupted, the redundant data bits corresponding to those data bits may include one or more different data bits.

Memory architecture 200 may include multiple regular data planes (e.g., data plane 0 through data plane 15) each of which is configured to store data bits and each of which coupled with a common word line (e.g., word line 210). Thus, the non-redundant data planes may be accessed with or selected by the same word line. The word line 210 may also be coupled with redundant data plane 205 and parity data plane 215. Parity data plane 215 may be configured to store parity bits for a codeword whose data bits are stored by the regular data planes. Alternatively, the parity bits may be stored in one or more of the regular data planes. Although shown with sixteen regular data planes, the redundancy repair and error correction techniques described herein can be implemented using any number of regular data planes.

At least some if not each regular data plane, redundant data plane 205, and parity data plane 215 may include one or more digit lines for outputting stored logic states as signals. The signals may be passed through one or more processing components, such as a sense amplifier, before being passed as data bits to data selectors. A data selector may select between regular data and redundancy data for an ECC operation. When a data selector selects redundancy data, the redundant data bits corresponding to regular data bits may be used to replace those regular data bits for an ECC operation.

In some examples, a data selector may select regular data for an ECC operation by establishing a conductive path between an ECC circuit and the digit(s) line from a regular data plane. Or the data selector may select redundant data for an ECC operation by establishing a conductive path between the ECC circuit and the digit line(s) from the redundant data plane 205. The data selector may establish a conductive path by activating and deactivating one or more switching components, such as transistors. Thus, memory architecture 200 may include a quantity of digit lines at least some of which may be coupled with a respective data plane and respective ECC circuit. Further, memory architecture 200 may include one or more digit lines coupled with redundant data plane 205 and redundant ECC circuit 235.

Each regular data plane may be associated with a corresponding ECC circuit in some cases. For example, there may be a one-to-one correspondence between ECC circuits and regular data planes. Thus, memory architecture 200 may include multiple ECC circuits, each of which is configured to receive data from a respective regular data plane. For example, ECC circuit 0 may receive data from data plane 0 via data selector 0, ECC circuit 1 may receive data from data plane 1 via data selector 1, and so on and so forth. Each ECC circuit may be designed to operate on data bits from its respective data plane as defined, for example, by a Hamming matrix. So different ECC circuits may be used for different regular data planes.

As described above, the regular data planes may be used to store information, such as a codeword (or the data portion of a codeword). In such cases, the parity data plane 215 may store the parity bits for the codeword (or the parity bits may be distributed among the memory cells of one or more regular data planes). For example, each of the regular data planes may store a portion (e.g., eight bits) of the requested data (e.g., a total of 128 bits) and the parity data plane 215 may store the corresponding parity bits (e.g., eight parity bits). In some cases, uncorrupted versions of the codeword data may be stored as redundant data in redundant data plane 205. For example, redundant data plane 205 may store eight redundant bits corresponding to the eight logic values represented by (or intended to be represented by) eight data bits stored in data plane 0. Thus, redundant data plane 205 may be configured to store redundant data that is the same as (or intended to be the same as) data stored at regular data plane 0. Discrepancies between regular data and corresponding redundant data may arise when the one or more bits of the regular data is corrupted (e.g., during the corresponding write operation or in between the write operation and a read operation).

When the stored information is requested by another device or component, the memory architecture 200 may perform a retrieval operation that involves reading the memory cells storing the information, performing ECC operations on the read data, correcting errors in the read data, and transferring the corrected data to an output bus 230 for transmission to the requesting device. To start the retrieval operation, the requested information may be passed (e.g., as a quantity of data bits) from the regular planes to the data selectors. However, if redundancy repair is a play (e.g., if one of the regular data planes is selected for redundancy repair), the redundant data from the redundant data plane 205 must be passed to the data selector corresponding to that data plane so that the redundant data (rather than the replaced regular data) undergoes ECC operations.

But transferring the redundant data from the redundant data plane 205 to the proper data selector (or ECC circuit) may increase the latency of the system because the travel time for the redundant data may be proportional to the length of the propagation path between the redundant data plane and the data selector. For example, when redundant data replaces data from regular data plane 0, the latency of the system may increase (compared to no redundancy repair) because the redundant data travels along propagation path 225-*a*, which in some cases may be up to 1 mm or more. In some cases, because error correction cannot occur until all relevant data has undergone ECC operations, any delay in providing data to the ECC circuits may result in a delay of the retrieval operation.

According to the techniques described here, the latency of a retrieval operation may be reduced by directly inputting redundant data into an ECC circuit corresponding to the redundant data plane 205. The ECC circuit corresponding to the redundant data plane 205 may be referred to as a redundant ECC circuit 235, and the redundant ECC circuit 235 may be configured to receive redundant data from the redundant data plane 205. Thus, each data plane, regular or otherwise, may have a corresponding ECC circuit. When redundant data is transferred to the ECC module 220, the redundant data may follow propagation path 225-b, which may be shorter than propagation path 225-a. Thus, the latency associated with transferring the redundant data to the ECC module may be reduced.

In a first embodiment, the redundant ECC circuit 235 may be coupled with enablement circuitry that selectively transfers an output of the redundant ECC circuit 235 to certain components of ECC circuitry 245. The components to which the output is transferred may be based on the data plane replaced by the redundant data. The relationship of the redundant ECC circuit 235 and the enablement circuitry is described with additional detail with reference to FIG. 6.

In a second embodiment, the redundant ECC circuit 235 may be coupled with a syndrome decoder that is adaptive. The syndrome decoder may be adaptive in that it may account for certain inputs (e.g., and ignore others), when decoding syndrome bits for the codeword. The adaptive syndrome decoder is described with additional detail with reference to FIG. 10, and the ECC circuit coupled with the syndrome decoder is described with additional detail with reference to FIG. 9.

A retrieval operation using redundant ECC circuit 235 is now described. For the purpose of illustration, the retrieval operation is described with reference to a codeword comprising 128 data bits and eight parity bits. But the techniques described herein may be implemented for codewords of any length.

During a write operation, the data for the codeword may have been distributed across the regular data planes. For example, each of the regular data planes may have been used to store eight bits of the codeword (resulting in 128 bits stored by the sixteen regular data planes). The eight parity bits may have been stored at parity data plane 215, and the eight bits stored at (or intended to be stored at) data plane 0 may have been stored as redundant data at redundant data plane 205.

During the retrieval process, each of the data planes (e.g., data planes 0 through 15) may be selected (e.g., using word line 210) and read. Thus, eight data bits may be transferred (e.g., via eight digit lines) from data plane 0 to data selector 0, eight bits may be transferred from data plane 1 to data selector 1, and so on and so forth. Each of the data selectors (except data selector 0) may establish a conductive path between the digit lines and the corresponding ECC circuit so that the data from each plane is input into the respective ECC circuit. Rather than transfer the data bits from data plane 0, however, data selector 0 may transfer null data bits (e.g., all zeros) so that the operations of the ECC module 220 are not corrupted (since data plane 0 has been selected for redundancy repair). Copies of the data bits input into the ECC module 220 (except the null data bits output by data selector 0) may also be transferred to the error correction module 240.

As for the eight redundant data bits stored by redundant data plane 205, these bits may be transferred directly to redundant ECC circuit 235 (e.g., as substitutes for the eight bits of data plane 0). Copies of the redundant data bits may also be transferred to error correction module 240 (e.g., via data selector 0 or some other component). Thus, all the data bits that make up the requested codeword may be present for correction at error correction module 240.

Figure 4:
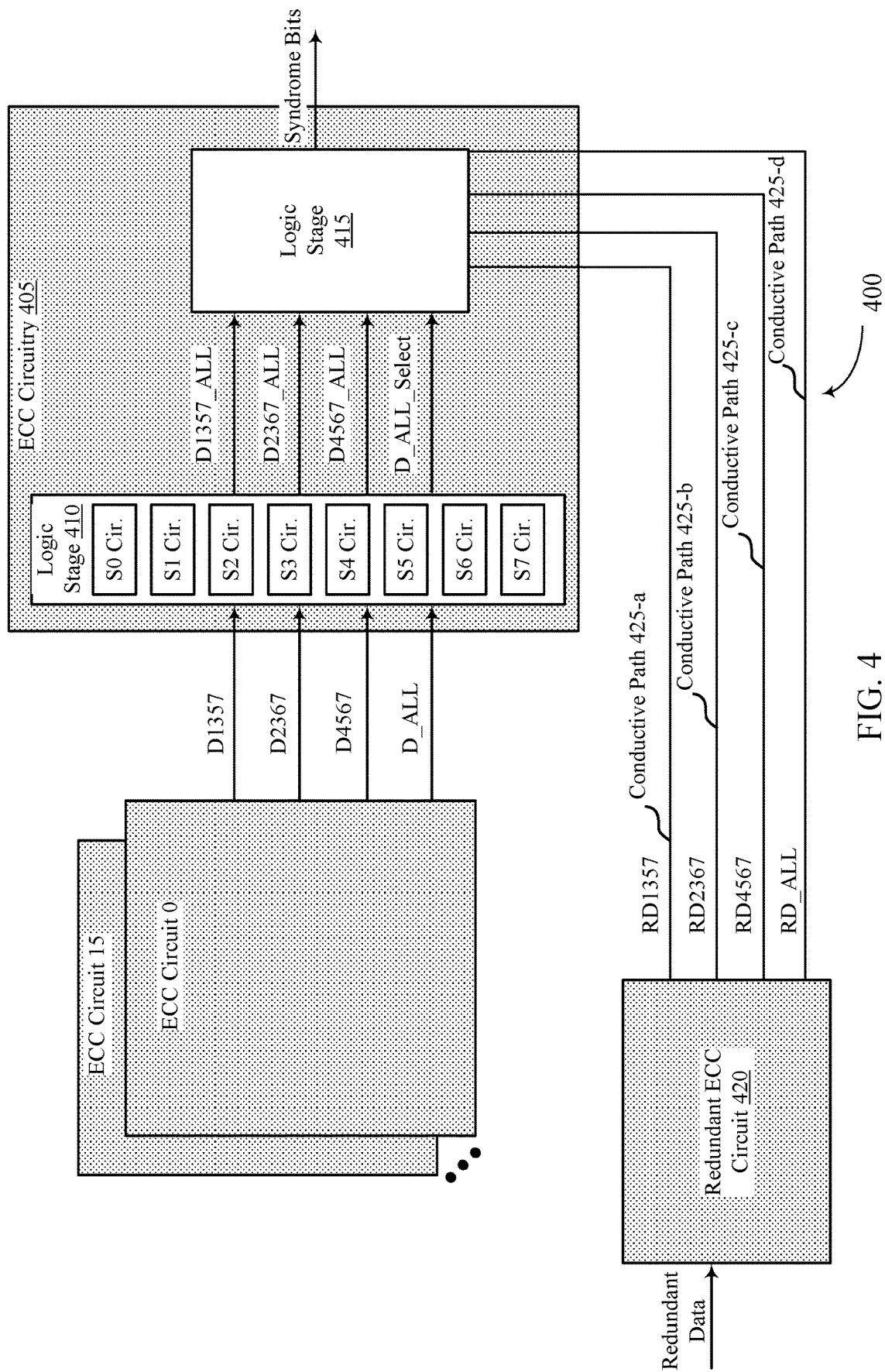
FIG. 4 illustrates an example ECC module that supports a direct-input redundancy scheme with a dedicated ECC circuit in accordance with various embodiments of the present disclosure.
Figure 7:
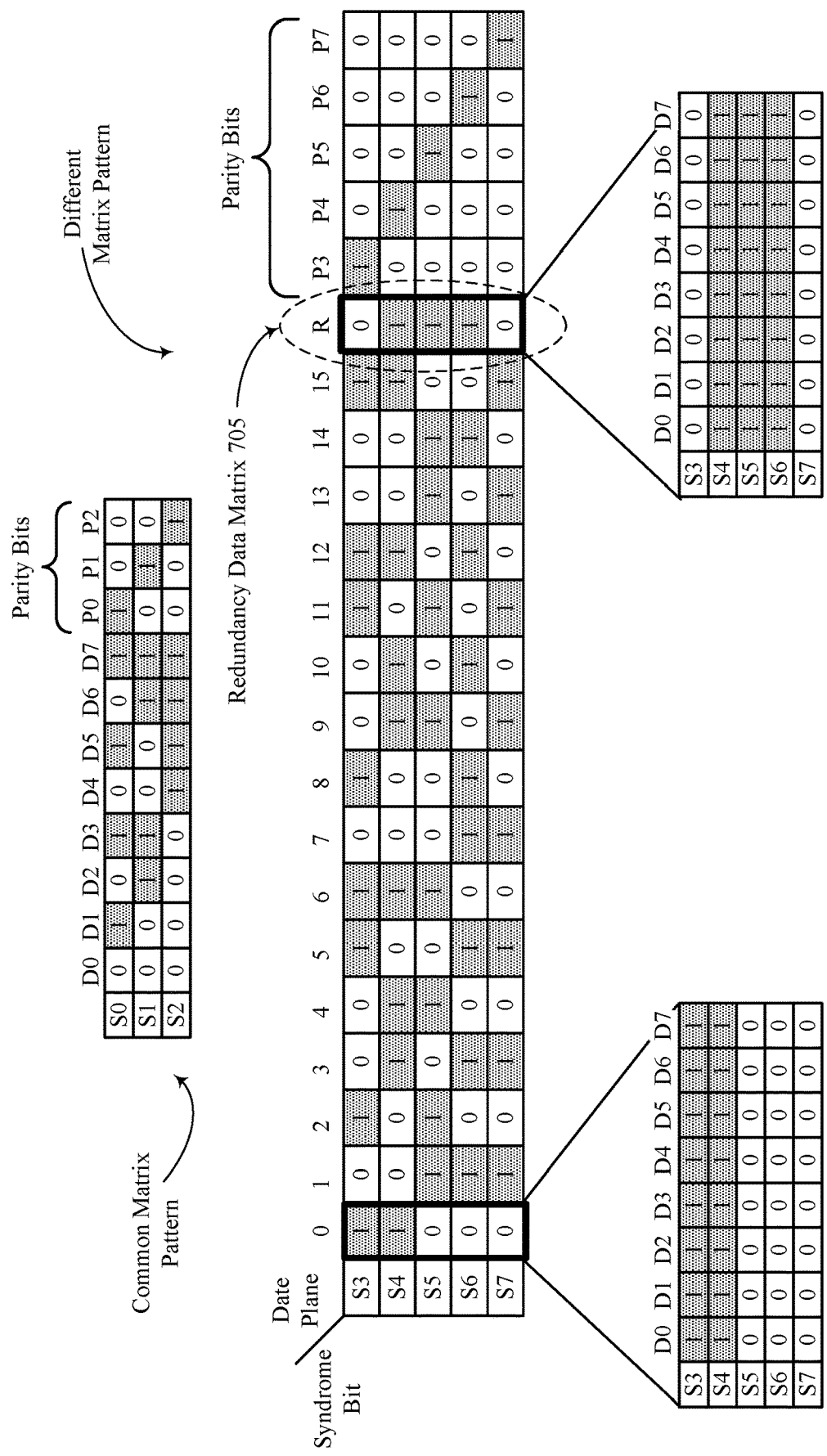
FIG. 7 illustrates an example Hamming matrix that supports a direct-input redundancy scheme with an adaptive syndrome decoder circuit in accordance with various embodiments of various embodiments of the present disclosure.

The ECC circuits may perform initial ECC operations on the data bits received from the data planes as described with more detail with reference to FIGS. 4 and 7. And the redundant ECC circuit 235 may perform initial ECC operations on the redundant data received from redundant data plane 205 as described with more detail with reference to FIGS. 5 and 8. The results of the initial ECC operations may be passed to ECC circuitry 245 for further processing (e.g., additional ECC operations). The output of ECC module 220 may be a quantity of syndrome bits that can be used for error correction. In some cases, the syndrome bits are derived from a bit-wise operation (e.g., an exclusive-OR operation) performed on the parity bits and the bits output from the ECC circuitry 245.

After the syndrome bits are generated by the ECC module 220, they may be compared to the parity bits to determine whether there is an error in the corresponding codeword. For example, an error may be detected if the syndrome bits do not match the parity bits. If an error is detected, the syndrome bits may be decoded (e.g., by a syndrome decoder included in the error correction module 240) to determine the location of the error. Once the location of the error is determined, the bit that is in error may be inverted (e.g., by a bit flipping circuit included in the error correction module 240) to correct the error. After error correction has been performed, the codeword may be transmitted to other components or devices via output bus 230.

Figure 3:
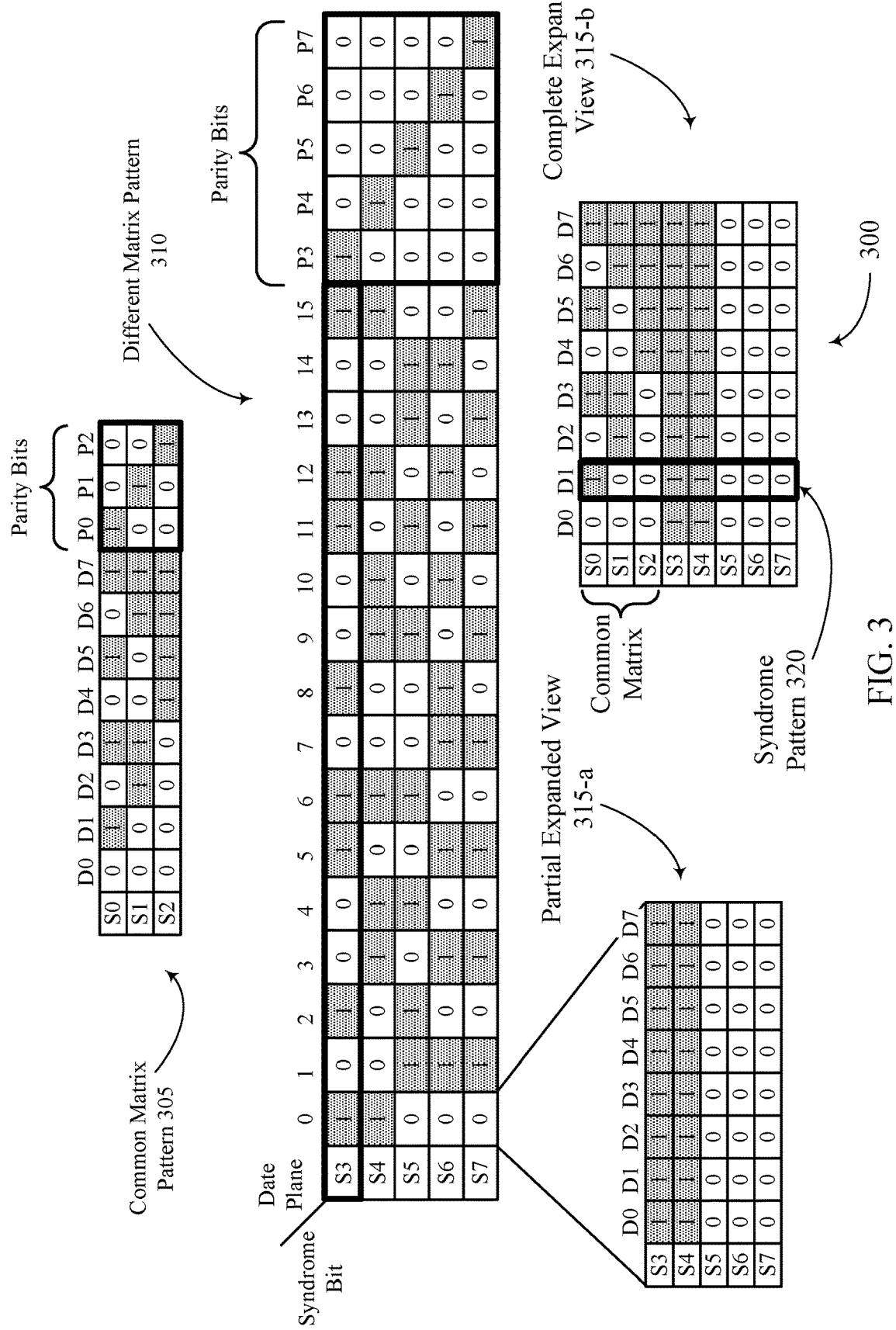
FIG. 3 illustrates an example Hamming matrix that supports a direct-input redundancy scheme with a dedicated ECC circuit in accordance with various embodiments of the present disclosure.

FIG. 3 illustrates an example Hamming matrix 300 that supports a direct-input redundancy scheme with a dedicated ECC circuit in accordance with various embodiments of the present disclosure. Hamming matrix 300 may represent a (136, 128) Hamming code that corresponds 128 data bits, eight parity bits, and 136 total bits. Hamming matrix 300 may be used in conjunction with ECC circuits such as those described with reference to FIG. 2. Although described with reference to a (136, 128) Hamming code, the techniques described herein can be implemented using any type of error correction code.

Hamming matrix 300 may illustrate the relationship between parity bits, syndrome bits, and data bits across multiple data planes (e.g., sixteen data planes spanning from data plane 0 to data plane 15). For example, Hamming matrix 300 may show how the parity bits of a codeword cover data from different data planes, and how corresponding syndrome bits can be generated from the data in those data planes.

Hamming matrix 300 may be used to detect an error in a codeword, as well as indicate the location of the error. For example, if the syndrome bits generated for a codeword do not match the parity bits for the codeword, then the mismatch may indicate that the codeword contains an error. But to locate the error, a device must know the data plane that stored the error, as well as the bit. To determine the location of the error at the bit-level within a particular data plane, the syndrome bits may be effectively compared to the syndrome patterns that make up each column of the Hamming matrix 300. The syndrome pattern that matches the syndrome bits may indicate the data plane that stored the error (via syndrome bits S3 through S7) and bit location (via syndrome bits S0 through S2). For example, if the generated syndrome bits match syndrome pattern 320, a device may determine that the error is in the data bit D1 (indicated by syndrome bits S0 through S2) of data plane 0 (indicated by syndrome bits S3 through S7).

Hamming matrix 300 may include a common matrix pattern 305 and a different matrix pattern 310. The common matrix pattern 305 shows the data bits that are covered by parity bits P0, P1, and P2. For example, as shown by Hamming matrix 300, parity bit P0 covers (e.g., is based on) data bits D1, D3, D5, and D7 for all of the data planes, parity bit P1 covers data bits D2, D3, D6, and D7 for all of the data planes, and parity bit P2 covers data bits D4, D5, D6, and D7 for all of the data planes.

The common matrix pattern 305 also shows the data bits that are used to generate syndrome bits S0, S1, and S2 (which together indicate the location of an error at the bit-level). The common matrix pattern 305 is referred to as "common" because it is the same for each data plane (since each data plane stores eight data bits, in this example, only three bits are needed to indicate which of the eight bits is an error). According to Hamming matrix 300, syndrome bit S0 can be generated by XOR-ing data bits D1, D3, D5, and D7 from all of the data planes, syndrome bit S1 can be generated by XOR-ing data bits D2, D3, D6, and D7 from all of the data planes, and syndrome bit S2 can be generated by XOR-ing data bits D4, D5, D6, and D7 from all of the data planes.

The different matrix pattern 310 shows the data bits that are covered by parity bits P3, P4, P5, P6, and P7. For example, according to Hamming matrix 300, parity bit P3 covers (e.g., is based on) all of the data bits in data planes 0, 2, 5, 6, 8, 11, 12, and 15, parity bit P4 covers all of the data bits in data planes 0, 3, 4, 6, 9, 10, 12, and 15, parity bit P5 covers all of the data bits in data planes 1, 2, 4, 6, 9, 11, 13, and 14, parity bit P6 covers all of the data bits in data planes 1, 3, 5, 7, 8, 10, 12, and 14, and parity bit P7 covers all of the data bits in data planes 1, 3, 5, 7, 9, 11, 13, and 15.

The different matrix pattern also shows the data bits that are used to generate syndrome bits S3, S4, S5, S6, and S7. The different matrix pattern 310 is referred to as "different" because the matrix for each data plane is different or unique. For example, the syndrome matrix for data plane 0 is different from the syndrome matrices for all the other data planes. This is because syndrome bits S3 through S7 indicate the data plane that stored the error. For example, a syndrome pattern of 11000 for S3 through S7 may indicate that data plane 0 stored the error, whereas a syndrome pattern of 11001 for S3 through S7 may indicate that data plane 15 stored the error. According to Hamming matrix 300, syndrome bit S3 may be generated by XOR-ring all of the data bits from data planes 0, 2, 5, 6, 8, 11, 12, and 15, syndrome bit S4 may be generated by XOR-ing all of the data bits from data planes 0, 3, 4, 6, 9, 10, 12, and 15, syndrome bit S5 may be generated by XOR-ing all of the data bits from data planes 1, 3, 5, 7, 8, 10, 12, and 14, and syndrome bit S7 may be generated by XOR-ing all of the data bits from data planes 1, 3, 5, 7, 9, 11, 13, and 15.

For ease of illustration, Hamming matrix 300 is presented in condensed form. However, it is to be understood that the different syndrome matrix for each data plane can be expanded as shown in partial expanded view 315-a for data plane 0. Similarly, the complete syndrome matrix for a data plane can be expanded as shown in complete expanded view 315-b for data plane 0.

FIG. 4 illustrates an example ECC module 400 that supports a direct-input redundancy scheme with a dedicated ECC circuit in accordance with various embodiments of the present disclosure. ECC module 400 may be an example of an ECC module described with reference to FIG. 2. ECC module 400 may be configured to generate and output a set of syndrome bits for a codeword that includes data bits from multiple data planes (e.g., data planes 0 through 15). ECC module 400 may perform the operations described using any combination of logic gates (e.g., OR, XOR, NOR, NAND, AND, NOT, and XNOR logic gates).

ECC module 400 may include multiple ECC circuits (e.g., one ECC for each data plane involved in the retrieval operation). For instance, ECC module 400 may include sixteen ECC circuits such as ECC circuits 0 through 15. ECC module 400 may also include ECC circuitry 405, which may be an example of ECC circuitry 245 described with reference to FIG. 2, and redundant ECC circuit 420, which may be an example of a redundant ECC circuit 235 described with reference to FIG. 2.

Each ECC circuit may be configured to perform one or more bit-wise operations on a set of data. A bit-wise operation may be an operation that operates on one or more bit patterns at the bit level to return a single-bit result. For example, each ECC circuit may include a quantity of logic gates, such as XOR logic gates, that receive one or more bits as inputs and that output a single bit.

Thus, each ECC circuit may be configured to perform bitwise operations on data from a respective data plane. For example, ECC circuit 0 may be configured to perform bitwise operations on data (e.g., eight data bits) from data plane 0. Accordingly, ECC circuit 0 may include a quantity of logic gates (or "bitwise operators"). The logic gates may operate on the data bits to output the result of one or more XOR operations to logic stage 410. For example, ECC circuit 0 may output the result of an XOR operation on data bits D1, D3, D5, D7 of data plane 0. The results of an XOR operation on data bits Dx, Dy, Dt, and Dz may be denoted and referred to herein as Dxytz. So the results of the operation performed by ECC circuit on data bits D1, D3, D5, and D7 may be denoted and referred to as D1357. Similarly, ECC circuit 0 may output D2367, D4567, and D_ALL (which refers to the result of an XOR operation on all data bits D0 through D8).

The other ECC circuits may also be configured to output the result of XOR operations similar to ECC circuit 0. For example, all of the ECC circuits may be configured to output D1357, D2367, D4567, and D_ALL for their respective data bits. The ECC circuits may transfer D1357, D2367, D4567, and D_ALL to logic stage 410. Thus, as indicated by Hamming matrix 300, every ECC circuit may transfer its respective D1357 to S0 circuitry ("S0 Cir."), D2367 to 51 circuitry ("51 Cir."), and D4567 to S2 circuitry ("S2 Cir.").

The S0 circuitry may operate on its inputs to obtain the result of an XOR operation on those inputs. Thus, the S0 circuitry may effectively output the result of an XOR operation on the data bits D1, D3, D5, D7 from each of the data planes (referred to as D1357_ALL). Similarly, the S1 circuitry may operate on its inputs to obtain the result of an XOR operation on those inputs. Thus, the S1 circuitry may effectively output the result of an XOR operation on the data bits D2, D3, D6, D7 from each of the data planes (referred to as D1357_ALL). Similarly, the S2 circuitry may operate on its inputs to obtain the result of an XOR operation on those inputs. Thus, the S2 circuitry may effectively output the result of an XOR operation on the data bits D4, D5, D6, D7 from each of the data planes (referred to as D4567_ALL). The outputs of S0 circuitry, S1 circuitry, and S2 circuitry may be transferred to logic stage 415 for additional operations.

Although every ECC circuit may output its respective D_ALL to logic stage 410, the D_ALL for each ECC circuit may be directed to only certain components of logic stage 410. For example, as indicated by the Hamming matrix 300, only ECC circuits 0, 2, 5, 6, 8, 11, 12, and 15 may transfer their respective D_ALL to S3 circuitry. This is because syndrome bit S3 is based on all the data bits from data planes 0, 2, 5, 6, 8, 11, 12, and 15. Similarly, only ECC circuits 0, 3, 4, 6, 9, 10, 12, and 15 may transfer their respective D_ALL to S4 circuitry, only ECC circuits 1, 2, 4, 6, 9, 11, 13, and 14 may transfer their respective D_ALL to D5 circuitry, only ECC circuits 1, 3, 5, 7, 8, 10, 12, and 14 may transfer their respective D_ALL to the S6 circuitry, and only ECC circuits 1, 3, 5, 7, 9, 11, 13, and 15 may transfer their respective D_ALL to the S7 circuitry. Thus, logic stage 410 may transfer to logic stage 415 the result of XOR operations on all the data from select data planes (referred to as D_ALL Select).

Redundant ECC circuit 420 may receive redundant data (e.g., eight bits of redundant data) from a corresponding redundant data plane (e.g., such as redundant data plane 205 described with reference to FIG. 2). Redundant ECC circuit 420 may perform bitwise operations on the redundant data to effectively obtain the results of XOR operations on the redundant data. For example, redundant ECC circuit 420 may perform bitwise operations on the redundant data to obtain the result of an XOR operation on redundant data bits RD1, RD3, RD5, and RD7 (denoted RD1357). Redundant ECC circuit 420 may also obtain the result of an XOR operation on redundant data bits RD2, RD3, RD6, and RD7 (denoted RD2367) and the result of an XOR operation on redundant data bits RD4, RD5, RD6, and RD7 (denoted RD4567). Additionally redundant ECC circuit 420 may obtain the results of an XOR operation on all the redundant data bits (denoted RD_ALL).

Redundant ECC circuit 420 may transfer RD1357, RD2367, and RD4567 to respective circuitry in logic stage 415 for the generation of syndrome bits S0, S1, and S2. For example, redundant ECC circuit 420 may transfer RD1357 to logic stage 415 over conductive path 425-a, may transfer RD2367 to logic stage 415 over conductive path 425-b, and may transfer RD4567 to logic stage 415 over conductive path 425-c. Redundant ECC circuit 420 may transfer RD1357, RD2367, and RD4567 regardless of which data plane is selected for redundancy repair (because S0, S1, and S2 are based on select data bits from all data planes).

However, redundant ECC circuit 420 may selectively transfer RD_ALL to a subset of components (e.g., logic gates) in logic stage 415 based on which data plane is selected for redundancy repair. This is because only certain syndrome bits are based on the data of a given data plane. For example, as indicated by Hamming matrix 300, syndrome bit S3 is based on the data in data planes 0, 2, 5, 6, 8, 11, 12, and 15, but not on the data from data planes 1, 3, 4, 7, 9, 10, 13, and 14. So if data plane 1 is selected for redundancy repair, redundant ECC circuit 420 may not pass RD_ALL to the component responsible for generating S3 because S3 does not rely on the data from data plane 1 (which has been replaced by the redundancy data). Thus, redundant ECC circuit 420 may selectively transfer RD_ALL (e.g., the result of a bitwise operation on the redundant data) to logic stage 415 over conductive path 425-d, which may be a conductive path between an output of redundant ECC circuit 420 and logic stage 415.

Logic stage 415 may receive outputs from logic stage 410 and redundant ECC circuit 420 and generate syndrome bits for the codeword. The syndrome bits may be generated according to Hamming matrix 300. The syndrome bits may be used in a subsequent error correction operation to correct an error in the codeword.

Figure 5:
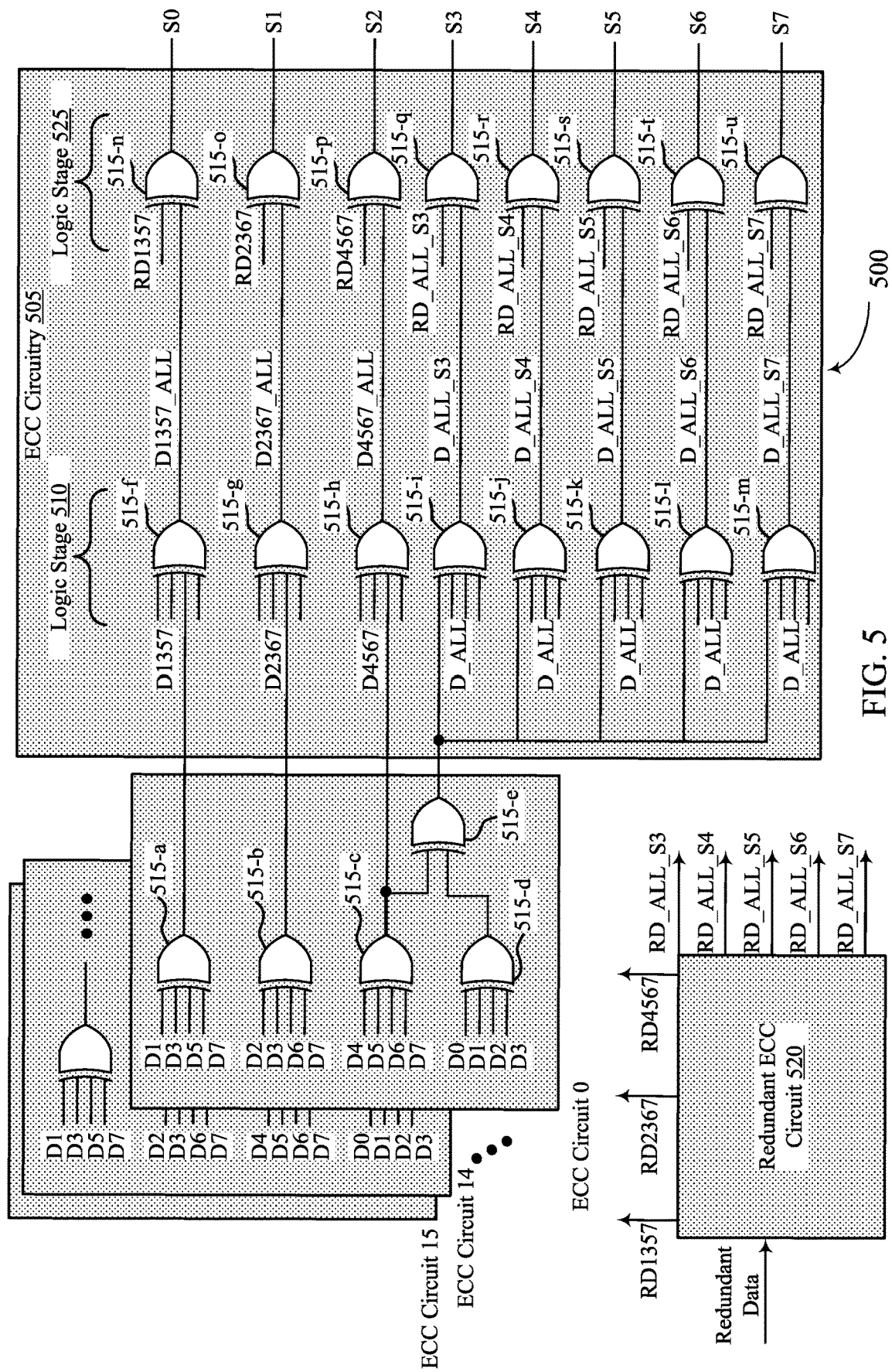
FIG. 5 illustrates an example ECC module that supports a direct-input redundancy scheme with a dedicated ECC circuit in accordance with various embodiments of the present disclosure.

FIG. 5 illustrates an example ECC module 500 that supports a direct-input redundancy scheme with a dedicated ECC circuit in accordance with various embodiments of the present disclosure. ECC module 500 may be an example of an ECC module described with reference to FIGS. 2 and 4. ECC module 500 may be configured to generate and output a set of syndrome bits for a codeword that includes data bits from multiple data planes (e.g., data planes 0 through 15).

ECC module 500 may include a quantity of ECC circuits that are examples of the ECC circuits described with reference to FIGS. 2 and 4. Each ECC circuit may be coupled with a respective data plane (e.g., ECC circuit 0 may be coupled with data plane 0, ECC circuit 1 may be coupled with data plane 1, etc.). ECC module 500 may also include ECC circuitry 505 and a redundant ECC circuit 520, which may be examples of ECC circuitry and a redundant ECC circuit as described with reference to FIGS. 2 and 4. Although described with reference to XOR gates, the functions of the ECC circuits and the ECC circuitry 505 may be realized using any type and combination of logic gates.

In this example, each ECC circuit may receive a quantity of data bits from its respective data plane and perform bit-wise operations on the quantity of data bits before outputting a single resulting bit to ECC circuitry 505. Since the syndrome bits for a (136, 128) Hamming code are derived from XORing various combinations of data bits in the codeword, the ECC circuits may perform XOR operations on their respective data bits. For example, ECC circuit n may include a quantity of XOR-logic gates configured to perform XOR operations on the data bits received from data plane n. The XOR operations may include XOR-ing data bits D1, D3, D5, and D7 (from data plane n) using a first logic gate, XOR-ing data bits D2, D3, D6, and D7 (from data plane n) using a second logic gate, XOR-ing data bits D4, D5, D6, and D7 (from data plane n) using a third logic gate, and XOR-ing data bits D0, D1, D2, and D3 (from data plane n) using a fourth logic gate. The ECC circuit n may also include an additional (e.g., fifth) logic gate configured to XOR the results of the XOR operations performed by the third and fourth logic gates.

Thus, as an example, ECC circuit 0 for data plane 0 may XOR data bits D1, D3, D5, and D7 (from data plane 0) using logic gate 515-a, XOR data bits D2, D3, D6, and D7 (from data plane 0) using logic gate 515-b, XOR data bits D4, D5, D6, and D7 (from data plane 0) using logic gate 515-c, and XOR data bits D0, D1, D2, and D3 (from data plane 0) using logic gate 515-d. ECC circuit 0 may also, using logic gate 515-e, XOR the results of the XOR operations of logic gate 515-c and 515-d, to effectively obtain the result of a single XOR operation on all of the data bits from data plane 0. Thus, the output of logic gate 515-a may be D1357, the output of logic gate 515-b may be D2367, the output of logic gate 515-c may be D4567, the output of logic gate 515-d may be D0123, and the output of logic gate 515-e may be D_ALL.

The results of XOR operations performed by different ECC circuits may be input into additional logic gates (e.g., included in logic state 510) to effectively obtain the result of a single XOR operation on those data bits. For example, in accordance with Hamming matrix 300, the data bits D1, D3, D5, and D7 from every data plane may be effectively XOR-ed by logic gate 515-f. This is because the result of every XOR operation on the selected data bits (D1, D3, D5, D7) for each data plane may be input into logic gate 515-f. For example, D1357 for each data plane 0 through 15 may be input into logic gate 515-f.

Regardless of the exact inputs, the output of logic gate 515-*f* may be the result of an XOR operation on the data bits D1, D3, D5, and D7 from all of the data planes implicated in the read operation. Similarly, the output of logic gate 515-*g* may be the result of an XOR operation on data bits D2, D3, D6, and D7 from all of the data planes implicated in the read operation. And the output of logic gate 515-*h* may be the result of an XOR operation on data bits D4, D5, D6, and D7 from all of the data planes implicated in the read operation. However, the data bits from a data plane selected for redundancy repair may have been nullified (e.g., set to zero) before insertion into the respective ECC circuit for that data plane. For example, when data plane 0 is selected for redundancy repair, the data bits D0 through D7 inserted into ECC circuit 0 may be all zeros. This technique prevents the replaced data bits from interfering with the syndrome generation process.

Unlike logic gates 515-*f* through 515-*h*, logic gates 515-*i* through 515—may not output the results of XOR operations performed on select data bits from all data planes. Rather, logic gates 515-*i* through 515—may output the results of XOR operations performed on all data bits from select data planes. For example, logic gate 515-*i* may, in effect, perform an XOR operation on all the data from data planes 0, 2, 5, 6, 8, 11, 12, and 15 (as dictated by the Hamming matrix 300). The result of this XOR operation may be denoted and referred to as D_ALL_S3 because it represents the XOR of all the relevant non-redundant data bits used in the generation of S3. However, as described above, the data from the replaced data plane (e.g., in this case data plane 0) may be nullified (e.g., set to zero) before insertion into ECC module 500.

As described with reference to FIG. 4, redundant ECC circuit 520 may also transfer signals to ECC circuitry 505 (e.g., to logic stage 525). For example, redundant ECC circuit 520 may transfer RD1357 to logic gate 515-*n*, RD2367 to logic gate 515-*o*, and RD4567 to logic gate 515-*p*. Thus, the result of an XOR operation on redundant data bits D1, D3, D5, and D7 may be passed to logic gate 515-*n*, the result of an XOR operation on redundant data bits D2, D3, D6, and D7 may be passed to logic gate 515-*o*, and the results of an XOR operation on redundant data bits D4, D5, D6, and D7 may be passed to logic gate 515-*p*.

Redundant ECC circuit 520 may also selectively transfer the XOR result of all redundant data bits to certain components of logic stage 525. For example, redundant ECC circuit 520 may pass RD_ALL to logic gate 515-*q* when the data plane selected for redundancy repair is one of the data planes upon which generation of syndrome bit S3 is based. When RD_ALL is passed to logic gate 515-*q*, it may be denoted and referred to as RD_ALL_S3. Thus, when data plane 0 is selected for redundancy repair, RD_ALL_S3 may be passed to logic gate 515-*q* (because S3 is generated based on all the data bits from data planes 0, 2, 5, 6, 8, 11, 12, and 15, and the redundant data represents the data from data plane 0). However, if data plane 1 is selected for redundancy repair, RD_ALL may not be passed to logic gate 515-*q* (because S3 is generated based on all the data bits from data planes 0, 2, 5, 6, 8, 11, 12, and 15, and the redundant data represents the data from data plane 1).

In a similar manner, RD_ALL may be passed to logic gate 515-*r* when the data plane selected for redundancy repair is one of the data planes upon which generation of syndrome bit S4 is based. When RD_ALL is passed to logic gate 515-*r*, it may be denoted and referred to as RD_ALL_S4. Thus, when data plane 0 is selected for redundancy repair, RD_ALL_S4 may be passed to logic gate 515-*r* (because S4 is generated based on all the data bits from data planes 0, 3, 4, 5, 8, 9, 12, and 15, and the redundant data represents the data from data plane 0). However, if data plane 1 is selected for redundancy repair, RD_ALL may not be passed to logic gate 515-*r* (because S4 is generated based on all the data bits from data planes 0, 3, 4, 5, 8, 9, 12, and 15, and the redundant data represents the data from data plane 1). Thus, the result of an XOR operation on all the redundant data bits may be passed from the redundant ECC circuit 520 to the ECC circuitry 505 based on the data plane selected for redundancy repair. To finish out the example for data plane 0, none of RD_ALL_S5, RD_ALL_S6, or RD_ALL_S7 may be passed to ECC circuitry 505 because none of these data planes are used to generate syndrome bits S5, S6, or S7 when data plane 0 is selected for redundancy repair.

Thus, logic gates 515-*q* through 515-*u* may each be described as a logic gate that is coupled with the ECC circuits and that is configured to receive a result of a bitwise operation on data bits from select data planes of the data planes. For a given logic gate, the result of the bitwise operation may be transferred over a conductive path between an output of the redundant ECC circuit 520 and an input of the logic gate. For example, the result of the bitwise operation may be transferred over conductive path 425-*d* as described with reference to FIG. 4. In some cases, another logic gate may be coupled with the ECC circuit 520 and may form part of the conductive path. For example, a logic gate 620, described with reference to FIG. 6, may form part of the conductive path.

The logic gates in logic stage 525 may receive the result of XOR operations on regular data and the result of XOR operations on redundant data. Each logic gate in logic stage 525 may perform an XOR operation on its inputs to output a syndrome bit (or a bit that serves as the basis for a syndrome bit). For example, logic gate 515-*n* may perform an XOR operation on D1357_ALL and RD1357 to obtain S0. Similarly, logic gate 515-*o* may perform an XOR operation on D2367_ALL and RD2367 to obtain 51. And logic gate 515-*p* may perform an XOR operation on D4567_ALL and RD4567 to obtain S2.

The other logic gates in logic stage 525 may also perform XOR operations on their respective inputs, one of which may be nullified by redundant ECC circuit 520 (as described with reference to FIG. 6). For example, when data plane 0 is selected for redundancy repair, logic gate 515-*q* may perform an XOR operation on D_ALL_S3 and RD_ALL_S3 to obtain syndrome bit S3. And logic gate 515-*r* may perform an XOR operation on D_ALL_S4 and RD_ALL_S4 to obtain syndrome bit S4. However, instead of operating on RD_ALL_S5, RD_ALL_S6, and RD_ALL_S7, logic gates 515-*s*, 515-*t*, and 515-*u* may operate on a null data bit (e.g., a logic zero). This is because syndrome bits S5, S6, and S7 are not based on the data from data plane 0. Thus, logic gate 515-*s* may perform an XOR operation on D_ALL_S5 and a logic zero to obtain syndrome bit S5. Similarly, logic gate 515-*t* may perform an XOR operation on D_ALL_S6 and a logic zero to obtain syndrome bit S6. And logic gate 515-*u* may perform an XOR operation on D_ALL_S6 and a logic zero to obtain syndrome bit S7.

Figure 6:
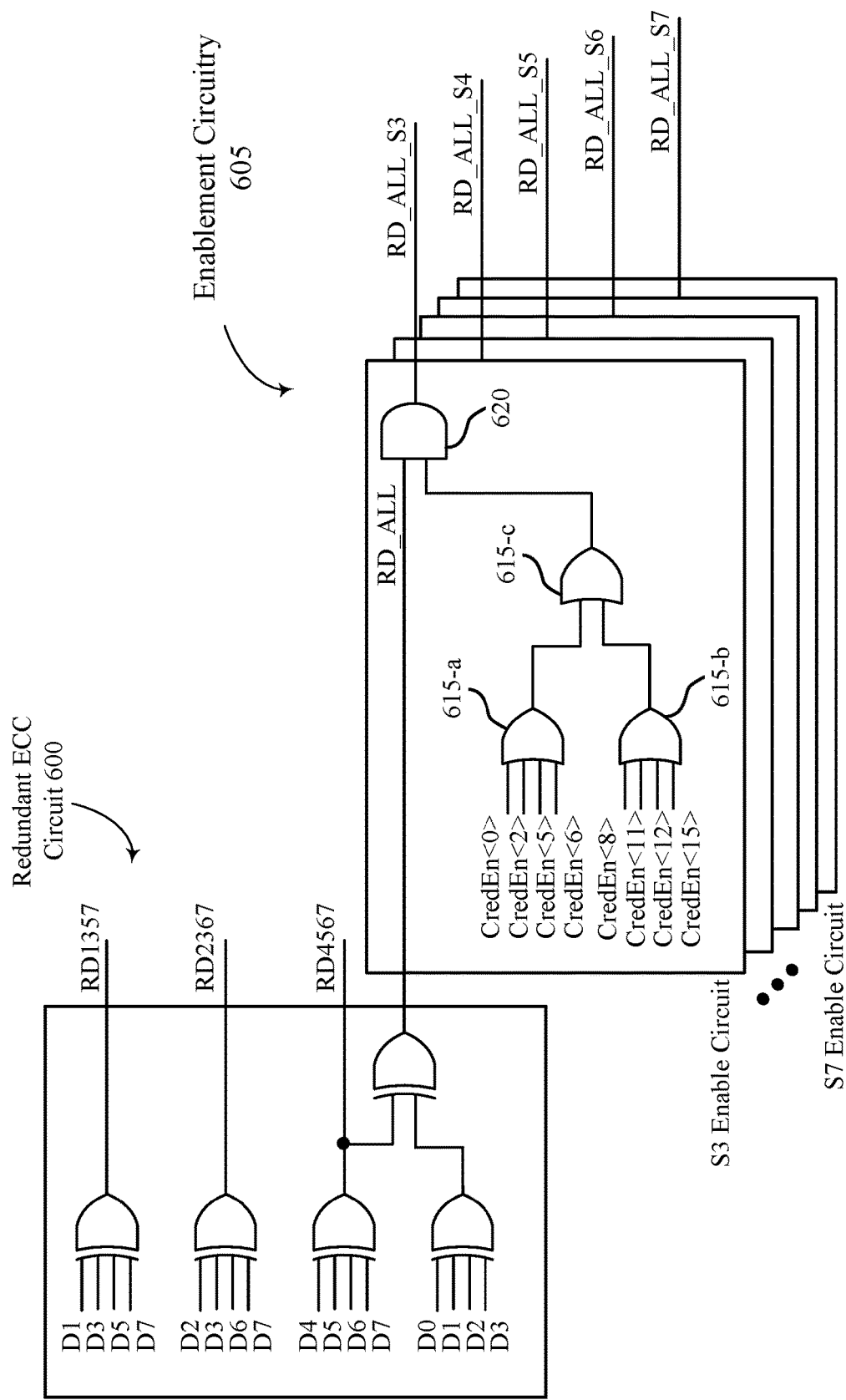
FIG. 6 illustrates an example redundant ECC circuit and enablement circuitry that supports a direct-input redundancy scheme with a dedicated ECC circuit in accordance with various embodiments of the present disclosure

FIG. 6 illustrates an example redundant ECC circuit 600 and enablement circuitry 605 that supports a direct-input redundancy scheme with a dedicated ECC circuit in accordance with various embodiments of the present disclosure. Redundant ECC circuit 600 may be an example of a redundant ECC circuit described with reference to FIGS. 2, 4, and 5. Thus, redundant ECC circuit 600 may be coupled with a redundant data plane via digit lines and may be configured to perform XOR operations on redundant data received from the redundant data plane. Taken in combination with enablement circuitry 605, redundant ECC circuit 600 may selectively transfer the results of the XOR operations on the redundant data to other component (e.g., to ECC circuitry 505 as described with reference to FIG. 5).

Redundant ECC circuit 600 may include a quantity of logic gates configured to output RD1357, RD2367, RD4567 and RD_ALL. However, it may be appropriate to pass RD_ALL to certain, select components of ECC circuitry 505. For example, when data plane 0 is selected for redundancy, it may be appropriate to pass RD_ALL to logic gate 515-q and logic gate 515-r, but not to logic gates 515-s through 515-u (because, in some cases, only syndrome bits S3 and S4 are based on data from data plane 0).

According to the techniques described herein, RD_ALL may be selectively transferred or nullified using enablement circuitry 605. Enablement circuitry 605 may include an enable circuit for each of syndrome bits S3 through S7. For example, enablement circuitry 605 may include S3 enable circuit for syndrome bit S3, S4 enable circuit for syndrome bit S4, S5, enable circuit for syndrome bit S5, S6 enable circuit for syndrome bit S6, and S7 enable circuit for syndrome bit S7. Each enable circuit may be coupled with a respective logic gate. For example, an output of S3 enable circuit may be coupled with logic gate 515-q, an output of S4 enable circuit may be coupled with logic gate 515-r, an output of S5 enable circuit may be coupled with logic gate 515-s, an output of S6 enable circuit may be coupled with logic gate 515-t, and an output of S7 enable circuit may be coupled with logic gate 515-u.

Each enable circuit may be configured to transfer or nullify an output of redundant ECC circuit 600. For example, S3 enable circuit may be configured to transfer RD_ALL (e.g., as RD_ALL_S3) or a logic zero based on the data plane selected for redundancy repair. Each enable circuit may include a quantity of OR logic gates 615 coupled with an AND gate 620.

Each enable circuit may receive RD_ALL and a respective control signal as inputs. The control signal may be a combination of control bits CredEn<x>, each of which indicates whether a respective data plane x has been selected for redundancy repair. For example, CredEn<0> may indicate that data plane 0 has been selected for redundancy repair when it is a logic one and may indicate that data plane 0 has not been selected for redundancy repair when it is a logic zero. Thus, in some cases, the control signal may indicate that the redundant data is related to (a substitute for) data stored by the data plane corresponding to the enable circuit receiving the control signal.

Each control bit of a control signal may represent the redundancy repair status of a data plane whose bits serve as the basis for the corresponding syndrome bit. Thus, the control bits for S3 enable circuit may be CredEn<0>, CredEn<2>, CredEn<5>, CredEn<6>, CredEn<8>, CredEn<11>, CredEn<12>, and CredEn<15> (because, as defined by Hamming matrix 300, S3 is generated based on an XOR of the data bits in data planes 0, 2, 5, 6, 8, 11, 12, and 15). As another example, the control bits for S4 enable circuit may be CredEn<0>, CredEn<3>, CredEn<4>, CredEn<6>, CredEn<9>, CredEn<10>, CredEn<12>, and CredEn<15> (because, as defined by Hamming matrix 300, S4 is generated based on an XOR of the data bits in data planes 0, 3, 4, 6, 9, 10, 12, and 15).

According to an example in which data plane 0 has been selected for redundancy repair, the control bits for S3 enable circuit may be 10000000 (starting with CredEn<0> and ending with CredEn<15>). Accordingly, OR logic gate 615-a may output a logic one, and OR logic gate 615-b may output a logic zero. The outputs of logic gates 615-a and 615-b may drive OR logic gate 615-c. Therefore, in this example, OR logic gate 615-c may output a logic one. The output of OR logic gate 615-c may in turn (and along with RD_ALL) drive AND logic gate 620 (e.g., in response to the control signal). So AND logic gate 620 may output RD_ALL (e.g., as RD_ALL_S3 to logic gate 515-q) when the output of OR logic gate 615-c is a one (as in this case) or output a logic zero when the output of OR logic gate 615-c is a zero (which would be the case, for example, if data plane 3 was selected for redundancy repair instead of data plane 0).

Thus, AND logic gate 620 may be described as an AND logic gate that is coupled with an output of a redundant ECC circuit and that is configured to output a signal representative of a result of an XOR operation on the redundant data (e.g., RD_ALL) based at least in part on a control signal (e.g., a control signal made up of control bits CredEn<*>). The signal may be transferred to a logic gate that is coupled with both an output of the AND logic gate 620 and a set of regular data planes. For example, the signal may be transferred to one or more of logic gates 515-q through 515-u as described with reference to FIG. 5.

In some cases, redundant ECC circuit 600 and enablement circuitry 605 may be operated as follows. Redundant ECC circuit 600 may perform a first bitwise operation (e.g., an XOR operation) on a first set of redundant data (e.g., redundant data bits 0 through 7 for a first codeword). The first set of redundant data may be the same as data stored at (or intended to be stored at) a first data plane (e.g., data plane 0). The result of the first bitwise operation may be transferred to a first set of logic gates (e.g., logic gates 515-q and 515-r, for syndrome bits S3 and S4) based on the redundant data being for the first data plane (e.g., data plane 0). In some cases, a first control signal may indicate that the redundant data is for the first data plane. A first set of syndrome bits may be generated for the first codeword based on the result of the first bitwise operation.

Redundant ECC circuit 600 may also perform a second bitwise operation (e.g., an XOR operation) on a second set of redundant data (e.g., redundant data bits 0 through 7 for a second codeword). The second set of redundant data may be the same as data stored at (or intended to be stored at) a second data plane (e.g., data plane 1). Redundant ECC circuit 600 may transfer the result of the second bitwise operation to a second set of logic gates (e.g., logic gates 515-s, 515-t, and 515-u, which correspond to syndrome bits S5, S6, and S7) that are different from the first set of logic gates (e.g., logic gates 515-q and 515-r, which correspond to S3 and S4). The result of the second bitwise operation may be transferred to the second set of logic gates based on the redundant data being for the second data plane (e.g., data plane 1). In some cases, a second control signal may indicate that the redundant data is for the second data plane. A second set of syndrome bits may be generated for the second codeword based on the result of the second bitwise operation.

FIG. 7 illustrates an example Hamming matrix 700 that supports a direct-input redundancy scheme with an adaptive syndrome decoder circuit in accordance with various embodiments of the present disclosure. Hamming matrix 700 may represent a (144, 136) Hamming code that corresponds 136 data bits, eight parity bits, and 144 total bits. Hamming matrix 700 may be used in conjunction with ECC circuits such as those described with reference to FIG. 8 and a redundant ECC circuit such as that described with reference to FIG. 9. Although described with reference to a (144, 136) Hamming code, the techniques described herein can be implemented using any type of error correction code.

Hamming matrix 700 may differ from Hamming matrix 300 in that it includes an additional matrix for redundancy data. This additional matrix may be referred to as redundancy data matrix 705. The addition of redundancy data matrix 705 may affect the generation of syndrome bits. For example, with the addition of redundancy data matrix 705, S3 is calculated by XORing the data bits from data planes 0, 2, 5, 6, 8, 11, 12, 15, and the redundancy data plane (as opposed to just XORing the data bits from data planes 0, 2, 5, 6, 8, 11, 12, 15). If an error occurs in the redundancy data, the fact that the error occurred in the redundancy data plane will be indicated by the last four syndrome bits S3 through S7 matching the pattern 01110. As before, the location of the data bit in error is indicated by the first three syndrome bits. Thus, the location of an error in data bit three from the redundancy data plane may be detected when the syndrome bits generated by an ECC module are 11001110 (and do not match the parity bits).

For ease of illustration, Hamming matrix 700 is presented in condensed form. However, it is to be understood that the different matrix for each data plane (and the redundancy data plane) can be expanded as discussed with reference to FIG. 3.

Figure 8:
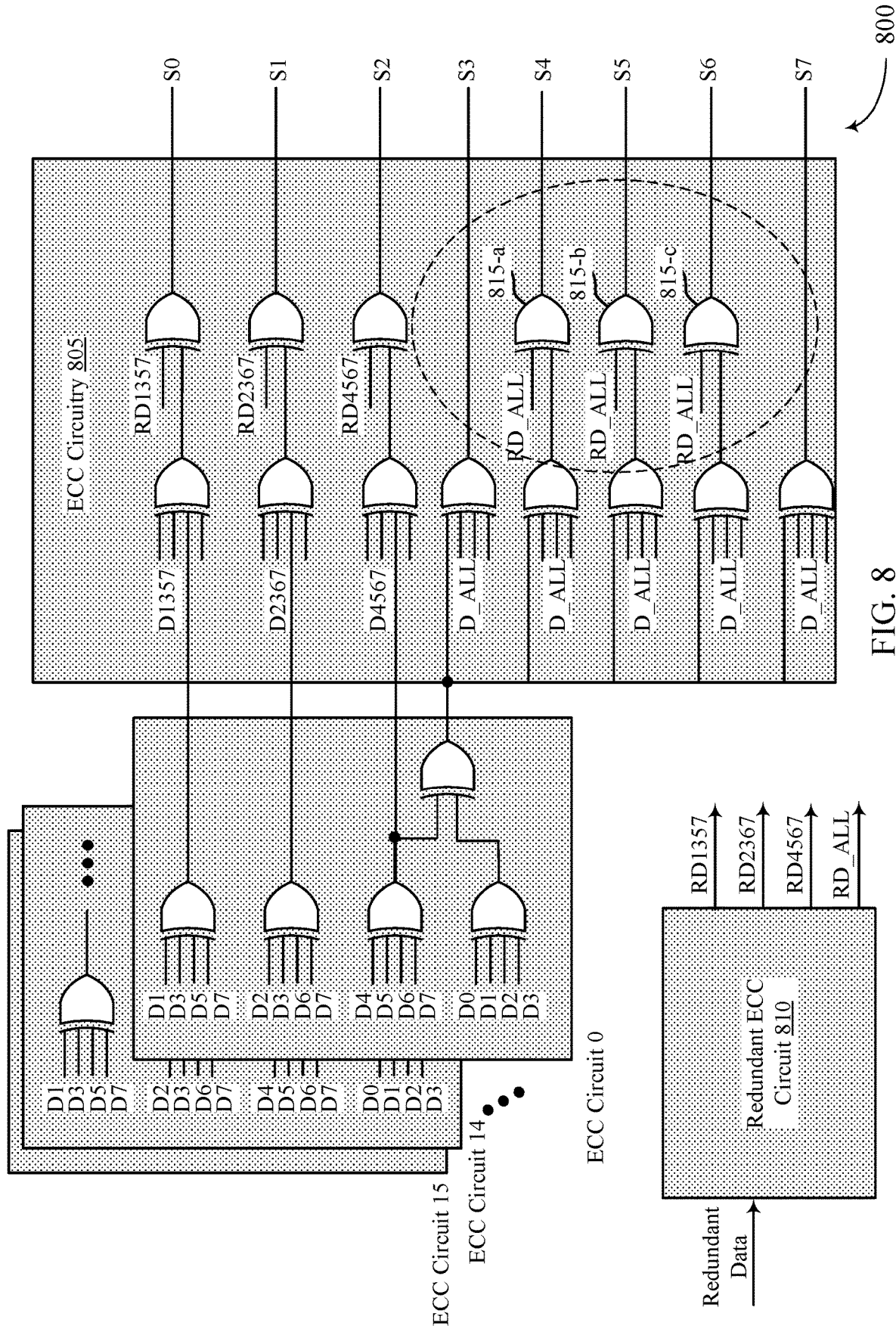
FIG. 8 illustrates an example ECC module that supports a direct-input redundancy scheme with adaptive syndrome decoder circuitry in accordance with various embodiments of the present disclosure.

FIG. 8 illustrates an example ECC module 800 that supports a direct-input redundancy scheme with adaptive syndrome decoder circuitry in accordance with various embodiments of the present disclosure. ECC module 800 may be an example of an ECC module described with reference to FIG. 2. ECC module 800 may be configured to generate and output a set of syndrome bits for a codeword that includes data bits from multiple data planes (e.g., data planes 0 through 15).

ECC module 800 may differ from ECC module 500 in the configuration of the circuitry that generates syndrome bits S3 through S7. Also, redundant ECC circuit 810 may be different (as discussed with reference to FIG. 9) from redundant ECC circuit 520. For example, redundant ECC circuit 810 may transfer RD_ALL to logic gates 815-a, 815-b, and 815-c regardless of which data plane is selected for redundancy repair in some cases. Also, no redundancy data may play a factor in the generation of syndrome bits S3 and S7 because, as shown in Hamming matrix 700, in some cases, only syndrome bits S4, S5, and S6 are based on redundancy data.

Figure 9:
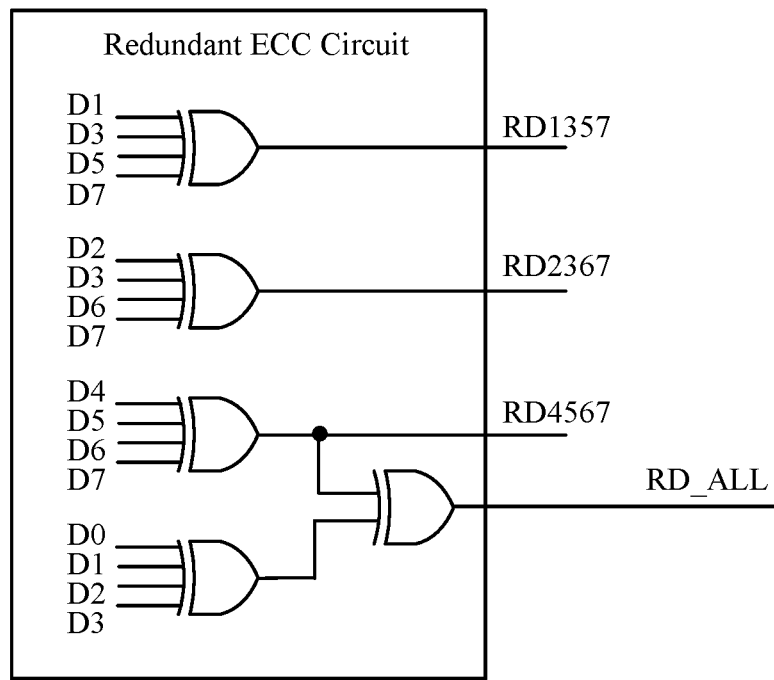
FIG. 9 illustrates an example redundant ECC circuit that supports a direct-input redundancy scheme with adaptive decoder circuitry in accordance with various embodiments of the present disclosure.

FIG. 9 illustrates an example redundant ECC circuit 900 that supports a direct-input redundancy scheme with adaptive decoder circuitry in accordance with various embodiments of the present disclosure. Redundant ECC circuit 900 may be an example of a redundant ECC circuit described with reference to FIG. 2. Redundant ECC circuit 900 may transfer the results of XOR operations on redundant data to other components regardless of which data plane is selected for redundancy repair. Such a scheme may be different from the scheme used for redundant ECC circuit 600. In the scheme for redundant ECC circuit 600, the results of XOR operations on redundant data may be selectively transferred to certain components based on the data plane that has been selected for redundancy repair.

For example, redundant ECC circuit 900 may transfer the results of XOR operations for error correction of two different codewords (e.g., a first codeword and a second codeword) as follows. To perform error correction on the first codeword, redundant ECC circuit 900 may perform a first bitwise operation (e.g., an XOR operation) on a first set of redundant data for a first data plane. The first set of redundant data may be data that is included in the first codeword and that corresponds to data stored by a first data plane. Redundant ECC circuit 900 may then transfer a result of the first bitwise operation (e.g., RD_ALL) to a combination of logic gates (e.g., logic gates 815-a, 815-b, and 815-c, which correspond to syndrome bits S4, S5, and S6). The result of the first bitwise operation may be transferred to the combination of logic gates independent of the first set of redundant data being for the first data plane. Next, a first set of syndrome bits for the first codeword may be generated based on the result of the first bitwise operation. In some cases, at least one of the syndrome bits of the first set may be generated by performing an XOR operation on the result of the first bitwise operation (e.g., syndrome bit S4 may be generated by logic gate 815-a performing an XOR operation on RD_ALL).

To perform error correction on the second codeword, redundant ECC circuit 900 may perform a second bitwise operation (e.g., an XOR operation) on a second set of redundant data for a second data plane that is different from the first data plane. The second set of redundant data may be data that is included in the second codeword and that corresponds to data stored by a second data plane. Redundant ECC circuit 900 may then transfer a result of the second bitwise operation (e.g., RD_ALL) to the same combination of logic gates (e.g., logic gates 815-a, 815-b, and 815-c, which correspond to syndrome bits S4, S5, and S6). The result of the second bitwise operation may be transferred to the combination of logic gates independent of the second set of redundant data being for the first data plane. Thus, a second set of syndrome bits for the second codeword may be generated based on the result of the second bitwise operation. In some cases, at least one of the syndrome bits of the second set may be generated by performing an XOR operation on the result of the first bitwise operation (e.g., syndrome bit S4 may be generated by logic gate 815-a performing an XOR operation on RD_ALL).

Figure 10:
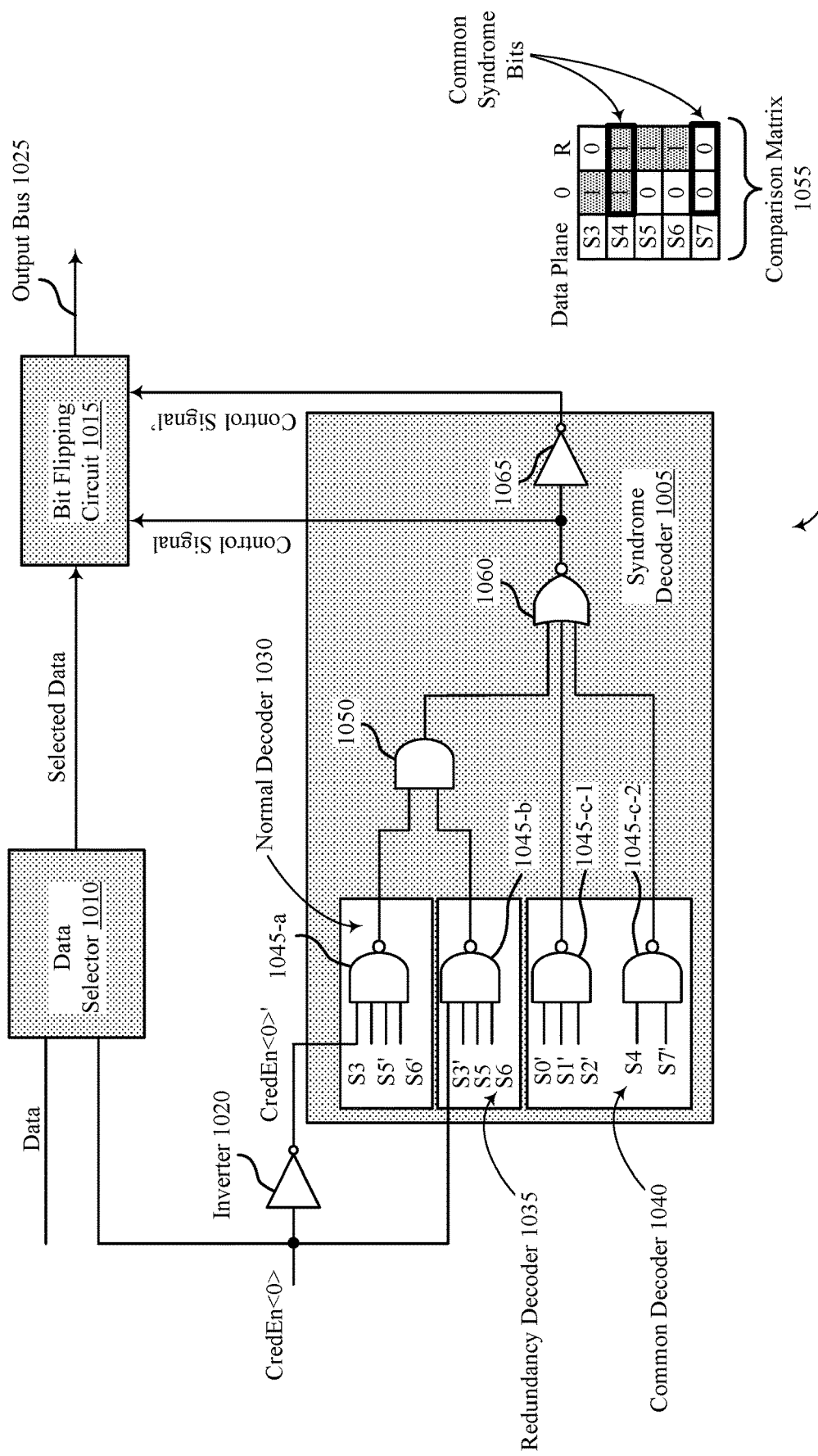
FIG. 10 illustrates an example error correction module that supports a direct-input redundancy scheme with adaptive decoder circuitry in accordance with various embodiments of the present disclosure.

FIG. 10 illustrates an example error correction module 1000 that supports a direct-input redundancy scheme with adaptive decoder circuitry in accordance with various embodiments of the present disclosure. Error correction module 1000 may be an example of an error correction module 240 described with reference to FIG. 2. Error correction module 1000 may include a syndrome decoder circuit 1005, a data selector 1010, a bit flipping circuit 1015, and an inverter 1020. Although shown as including a single syndrome decoder circuit, error correction module 1000 may include multiple syndrome decoders (e.g., one for each data plane). In this example, syndrome decoder circuit 1005 may be for a first data plane (e.g., data plane 0). Error correction module 1000 may perform error correction on data bits that make up, for example, a codeword.

Syndrome decoder circuit 1005 may include multiple decoders, and each decoder may be made up of one or more logic gates. In this example, the decoder circuits include NAND logic gates. However, other types of logic gates can be used to implement the techniques described herein.

During an error correction operation, data selector 1010 may receive a data bit (e.g., from one of the regular data planes discussed with reference to FIG. 2, or from the redundant data plane 205). During the same error correction operation, inverter 1020 may receive a control signal (e.g., CredEn<x>) that indicates whether the data plane x corresponding to the syndrome decoder circuit 1005 has been selected for redundancy repair. For example, when the syndrome decoder circuit 1005 corresponds to data plane 0, inverter 1020 may receive control signal CredEn<0> which indicates whether data plane 0 has undergone redundancy repair.

Data selector 1010 may also receive the control signal (e.g., CredEn<x>) and use the control signal as the basis for selecting redundancy data or normal data for error correction. After selecting the data, data selector 1010 may transfer the selected data to bit flipping circuit 1015. However, bit flipping circuit 1015 may invert the data bit if instructed to do so by syndrome decoder circuit 1005. Otherwise, the data bit may be transferred without inversion to output bus 1025, which may be an example of output bus 230 described with reference to FIG. 2.

Upon receiving the control signal CredEn<x>, inverter 1020 may invert the control signal to produce an inverted (or "complemented") version of the control signal, which may be referred to as CredEn<x>'. In the example of data plane 0, inverter 1020 may output CredEn<0>'. In general, the inverted version of a bit or control signal n may be denoted n'.

Syndrome decoder circuit 1005 may receive the control signal and the inverted version of the control signal as inputs. For example, redundancy decoder 1035 may receive the control signal and normal decoder 1030 may receive the inverted version of the control signal. In the example of data plane 0, redundancy decoder 1035 (e.g., logic gate 1045-*b*) may receive CredEn<0> and normal decoder 1030 (e.g., logic gate 1045-*a*) may receive CredEn<0>'. Given the relationship between redundancy decoder 1035, normal decoder 1030, and logic gate 1050, using the control signal and inverted controls signal as inputs into redundancy decoder 1035 and normal decoder 1030, respectively, ensures that the output of either redundancy decoder 1035 or normal decoder 1030 is effectively nullified.

Each of the decoders in syndrome decoder circuit 1005 may receive a quantity of syndrome-based bits (e.g., syndrome bits or inverted syndrome bits) as inputs. These inputs may change based on the location of the bit undergoing error correction. For instance, different inputs may be used depending on whether the bit is the first bit (e.g., data bit 0) or last bit (e.g., data bit 7) stored by the data plane undergoing the error correction operation. Thus, in addition to receiving the control signal, redundancy decoder 1035 may also receive a quantity of syndrome-based inputs. And in addition to receiving the inverter control signal, normal decoder 1030 may receive a set of syndrome-based inputs. According to the techniques described herein, the syndrome-based bits received by normal decoder 1030 may be inverted versions (or "complements") of the syndrome-based bits received by redundancy decoder 1035. The reason for this is explained below.

In the example of data plane 0, common decoder 1040 may receive S0', S1', and S2' at logic gate 1045-*c*-1 and receive S4 and S7' at logic gate 1045-*c*-2. Common decoder 1040 may be referred to as "common" because it receives as inputs the syndrome bits that are common (according to Hamming matrix 700) to data plane 0 and the redundancy data plane. This can be readily seen by placing the two matrices next to each other in comparison matrix 1055, which shows that syndrome bit S4 (equal to 1) and syndrome bit S7 (equal to 0) are the same for both data plane 0 and the redundant data plane. Because they are part of the common matrix, S0, S1, and S2 are also the same for data plane 0 and the redundant data plane. Thus, in an example where data plane 0 has undergone redundancy repair, common decoder 1040 may receive versions of syndrome bits S0, S1, S2, S4, and S7.

Whether a syndrome bit is inverted before insertion into error correction module 1000 is determined based on the expected value for the syndrome bit as given by the Hamming matrix 700. For example, the syndrome bits may be processed (e.g., inverted) so that if they are true to Hamming matrix 700, only logic ones will be input into syndrome decoder circuit 1005. For example, when performing an operation to detect an error in data bit 0 of data plane 0, syndrome bits S0, S1, S2, S5, S6, and S7 may be inverted so that they appear as logic ones to the syndrome decoder circuit 1005. Similarly, when performing an operation to detect an error in data bit 0 of the redundant data plane, syndrome bits S3 and S7 may be inverted so that they appear as logic ones to the syndrome decoder circuit 1005.

Because syndrome bits S3, S5, and S6 are different between the matrices for data plane 0 and the redundant data plane (e.g., 100 for data plane 0 compared to 011 for the redundant data plane), they must be treated differently and input into different decoders. In the data plane 0 example, syndrome bits S5 and S6 may be inverted so that S3, S5' and S6' (e.g., 111) can be input into normal decoder 1030. And syndrome bit S3 may be inverted so that S3', S5, and S6 (111) can be input into redundancy decoder 1035. Thus, the redundancy decoder 1035 may receive as inputs the complements (S3', S5, S6) of the syndrome-based inputs (S3, S5', S6') received by normal decoder 1030 (and vice versa).

After receiving their respective inputs, normal decoder 1030, redundancy decoder 1035, and common decoder 1040 may transfer the results of a NAND operation on those inputs to other components of syndrome decoder circuit 1005. In the example of data plane 0, normal decoder 1030 may transfer the results of a NAND operation on S3, S5', and S6'. If all the inputs for normal decoder 1030 are logic ones, then normal decoder 1030 may output a logic zero. Otherwise, normal decoder 1030 may output a logic one. Similarly, if all the inputs for redundancy decoder 1035 are logic ones, then redundancy decoder 1035 may output a logic zero. Otherwise, redundancy decoder 1035 may output a logic zero.

Logic gate 1050 may be (or perform the operations of) an AND logic gate. Logic gate 1050 may receive as inputs the outputs of normal decoder 1030 and redundancy decoder 1035. Logic gate 1050 may perform an AND operation on its inputs and output the result of the AND operation (e.g., to logic gate 1060). Thus, logic gate 1050 may be configured so that in effect, the output of either normal decoder 1030 or redundancy decoder 1035 is passed to the next stage (e.g., to logic gate 1060).

Since logic gate 1050 is driven by the output of either normal decoder 1030 or redundancy decoder 1035, and since the driving output is determined based on the control signal, syndrome decoder circuit 1005 is configured to adjust its output based at least in part on whether the redundant data received by the redundant ECC circuit corresponds to data stored by the first data plane.

To put it another way, the output of syndrome decoder circuit 1005 may be based on a first set of inputs (e.g., the inputs for normal decoder 103) and a second set of inputs (e.g., the inputs for redundancy decoder 1035). According to the techniques described herein, syndrome decoder circuit 1005 may control its output by nullifying the first set of inputs when the redundant data is for (e.g., corresponds to) the first data plane and nullifying the second set of inputs when the redundant data is for (e.g., corresponds to) a data plane other than the first data plane. A set of inputs may be referred to as nullified if they do not change the output of syndrome decoder circuit 1005.

Logic gate 1060 may be (or perform the functions of) a NOR logic gate. Logic gate 1060 may receive as inputs the outputs of common decoder 1040 and the output of logic gate 1050. In the example of data plane 0, the outputs of common decoder 1040 may be 1) the result of a NAND operation on the S0', S1', and S2 and 2) the result of a NAND operation on S4 and S7'. Logic gate 1060 may perform a NOR operation on its inputs and output the result of the NOR operation to, for example, inverter 1065 and/or bit flipping circuit 1015). Inverter 1065 may invert the output of logic gate 1060 and transfer the inverted version of the output of logic gate 1060 to bit flipping circuit 1015. Thus, syndrome decoder circuit 1005 may be configured to output a control signal that indicates whether a selected data bit is to be inverted.

Bit flipping circuit 1015 may also receive selected data from data selector 1010. For example, bit flipping circuit 1015 may receive a regular data bit from data plane 0 (e.g., when data plane 0 is not selected for redundancy repair) or a redundant data bit from the redundancy data plane (e.g., when data plane 0 is selected for redundancy repair). Based on the outputs of syndrome decoder circuit 1005 (e.g., control signal and control signal'), bit flipping circuit 1015 may invert the data bit. After inverting the data bit, or after refraining from inverting the data bit, bit flipping circuit 1015 may output the data bit (or inverted data bit) to output but 1025 for communication to other components. Thus, error correction module 1000 may perform error correction on a data bit from a regular data plane or a redundancy data plane.

Figure 11:
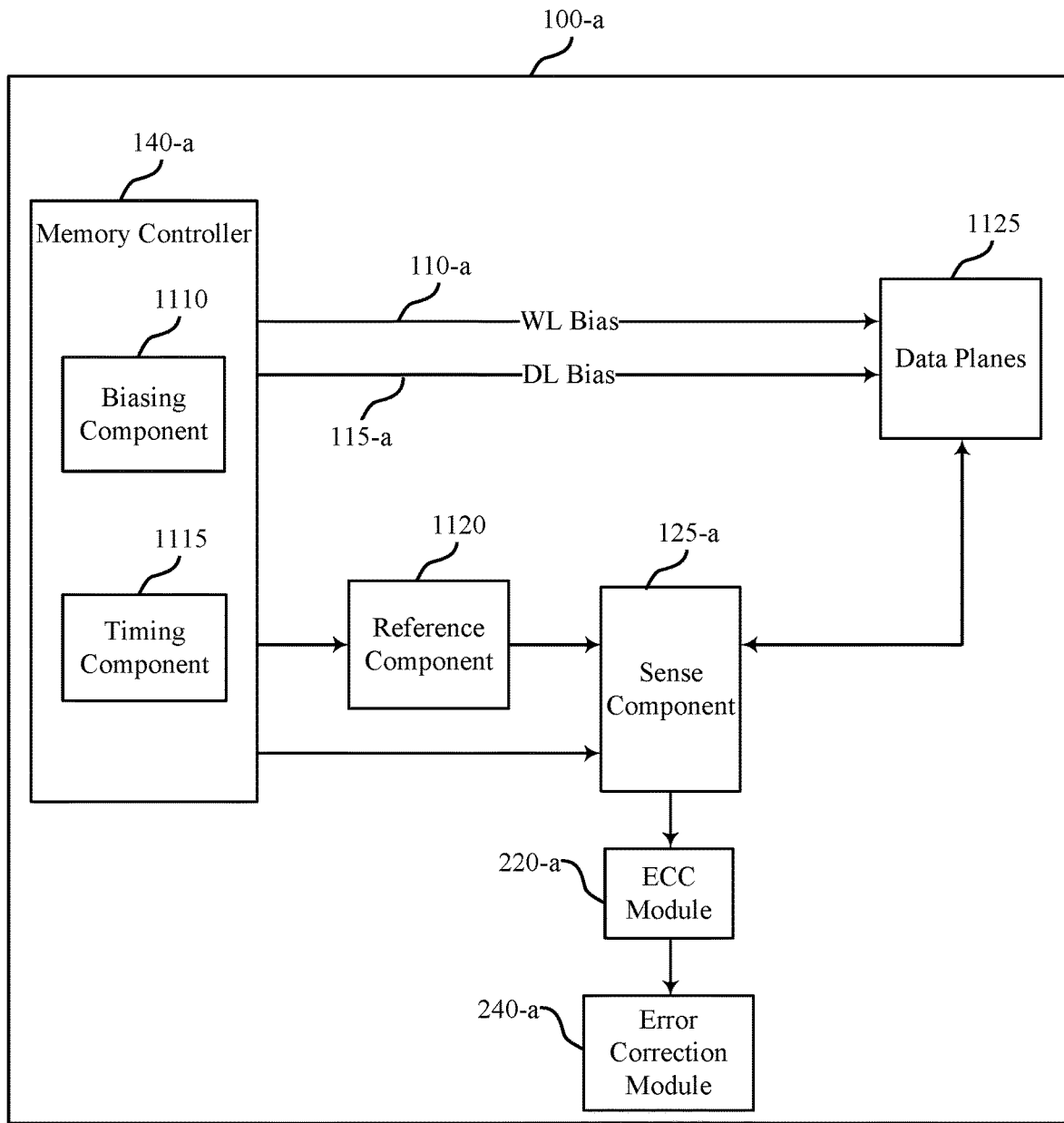
FIG. 11 illustrates a block diagram of a memory array that supports a direct-input redundancy scheme with adaptive decoder circuitry in accordance with various embodiments of the present disclosure.

FIG. 11 illustrates a block diagram 1100 of a memory array that supports a direct-input redundancy scheme with adaptive decoder circuitry in accordance with various embodiments of the present disclosure. Block diagram 1100 may include memory array 100-*a*, which may be an example of a memory array 100 as discussed with reference to FIG. 1. Memory array 100-*a* may be referred to as an electronic memory apparatus and may include memory controller 140-*a*, word line 110-*a*, bit line 115-*a*, and sense component 125-*a*, which may be examples of a memory controller 140, word line 110, bit line 115, and sense component 125 described with reference to FIG. 1. Memory array 100-*a* may include data planes 1125, which may include regular data planes, redundancy data planes, and parity data planes.

Memory array 100-*a* may also include reference component 1120, ECC module 220-*a*, and error correction module 240-*a*. The components of memory array 100-*a* may be in electronic communication with each other and may perform the functions described with reference to FIGS. 1-10.

Memory controller 140-*a* may, in combination with other components apply voltages throughout memory array 100-*a*, write data to memory cells 105-*a*, read data from data plans 1125, and generally operate memory array 100-*a* as described in FIGS. 1-10. Memory controller 140-*a* may include biasing component 1110 and timing component 1115. Memory controller 140-*a* may be in electronic communication with data planes 1125, sense component 125-*a*, and reference component 1120.

Biasing component 1110 may be configured (e.g., by memory controller 140-*a*) to activate word line 110-*a* or digit line 115-*a* by applying voltages to those various nodes. For example, biasing component 1110 may be configured to apply a voltage to read or write a memory cell as described herein. In some cases, memory controller 140-*a* may include a row decoder, column decoder, or both, as described with reference to FIG. 1. This may enable memory controller 140-*a* to access one or more memory cells within a data plane 1125. Biasing component 1110 may also provide voltage potentials to reference component 1120 in order to generate a reference signal for sense component 125-*a*. Additionally, biasing component 1110 may provide voltage potentials for the operation of sense component 125-*a*.

Timing component 1115 may be configured to control the timing of the various word line selections, plate biasing, or component activation/deactivation. For example, timing component 1115 may control the timing of voltage application to perform the memory functions, such as reading and writing, and error correction, discussed herein. In some cases, timing component 1115 may control the operations of biasing component 1110.

Reference component 1120 may include various components to generate a reference signal for sense component 125-*a*. Reference component 1120 may include circuitry configured to produce a reference signal.

Sense component 125-*a* may compare a signal from a memory cell with a reference signal from reference component 1120. Upon determining the logic state stored by the memory cell, the sense component 125-*a* may transfer a signal representative of the logic state to other components of memory array 100-*a*. In some cases, the signal representative of the logic state may be transferred to a data selector, as described with reference to FIG. 2, which may in turn transfer the signal to ECC module 220-*a* and/or error correction module 240-*a*. In some cases, reference component 1120 and sense component 125-*a* may be components of memory controller 140-*a*.

In some cases, memory controller 140-*a*, in combination with ECC module 220-*a* and error correction module 240-*a*, may perform error correction on a codeword retrieved from data planes 1125. As part of the error correction operation, memory array 100-*a* may (e.g., via ECC module 220-*a*) generate syndrome bits for data stored by data planes 1125. Memory array 100-*a* may then select a data bit from the data for the error correction operation. Memory array 100-*a* may transfer, to a syndrome decoder configured for the error correction operation, a control signal indicating whether the data bit is substitute for a data bit stored by one of the data planes. Based on the control signal, memory array 100-*a* may decode the syndrome bits to determine whether the data bit should be corrected (e.g., inverted).

Figure 12:
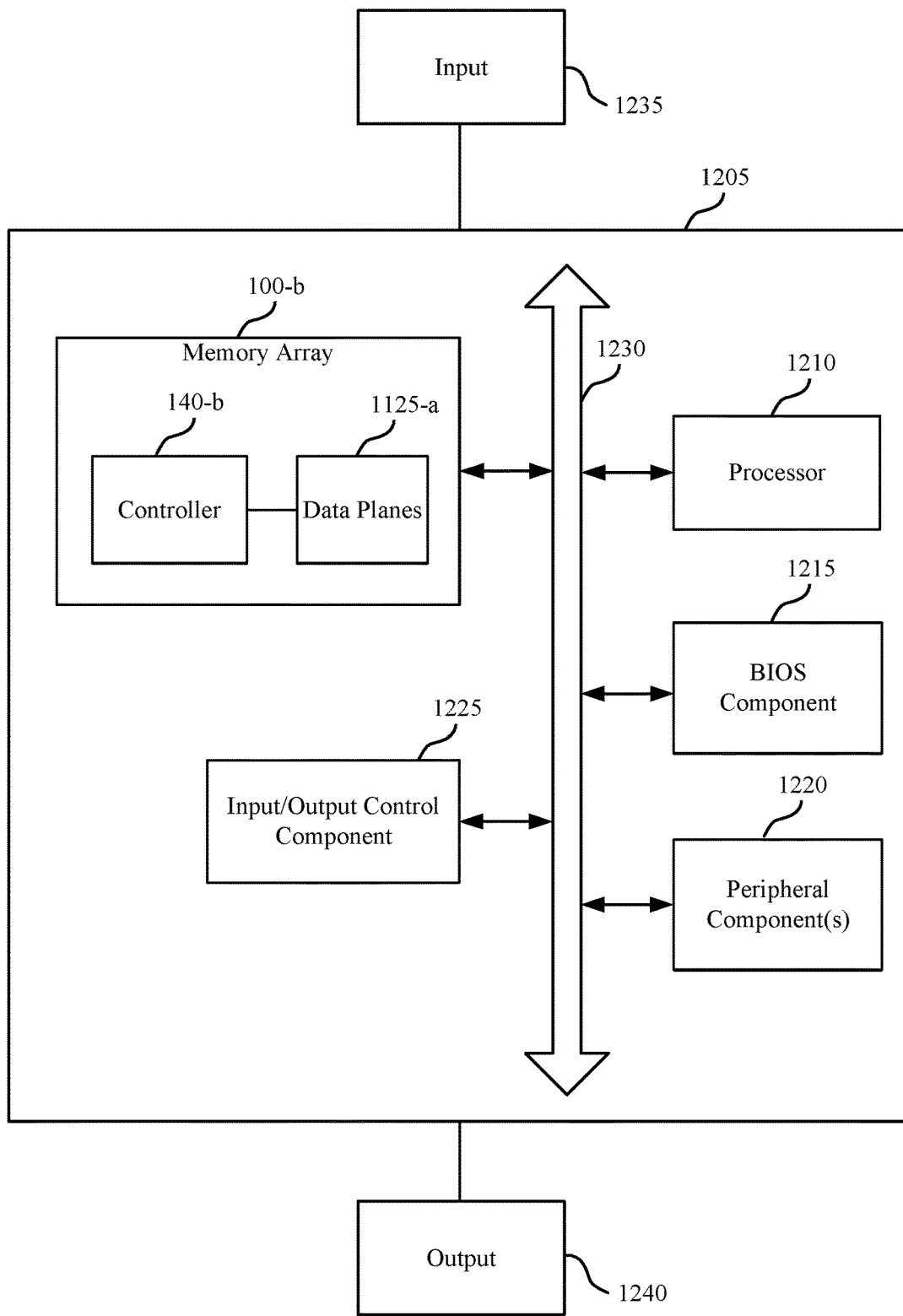
FIG. 12 illustrates a system that supports a direct-input redundancy scheme with adaptive decoder circuitry in accordance with various embodiments of the present disclosure.

FIG. 12 illustrates a system 1200 that supports a direct-input redundancy scheme with adaptive decoder circuitry in accordance with various embodiments of the present disclosure. System 1200 includes a device 1205, which may be or include a printed circuit board to connect or physically support various components. Device 1205 includes a memory array 100-*b*, which may be an example of memory array 100 described with reference to FIGS. 1 and 11. Memory array 100-*b* may contain memory controller 140-*b* and data planes 1125-*a*, which may be examples of a memory controller 140 and data planes 1125 as described with reference to FIGS. 1 and 11. Device 1205 may also include a processor 1210, BIOS component 1215, peripheral component(s) 1220, and input/output control component 1225. The components of device 1205 may be in electronic communication with one another through bus 1230.

Processor 1210 may be configured to operate memory array 100-*b* through memory controller 140-*b*. In some cases, processor 1210 may perform the functions of memory controller 140 described with reference to FIGS. 1 and 11. In other cases, memory controller 140-*b* may be integrated into processor 1210. Processor 1210 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 1210 may perform various functions described herein. Processor 1210 may, for example, be configured to execute computer-readable instructions stored in memory array **100-*b* to cause device 1205** perform various functions or tasks.

BIOS component 1215 may be a software component that includes a basic input/output system (BIOS) operated as firmware, which may initialize and run various hardware components of system 1200. BIOS component 1215 may also manage data flow between processor 1210 and the various components, e.g., peripheral components 1220, input/output control component 1225, etc. BIOS component 1215 may include a program or software stored in read-only memory (ROM), flash memory, or any other non-volatile memory.

Peripheral component(s) 1220 may be any input or output device, or an interface for such devices, that is integrated into device 1205. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1225 may manage data communication between processor 1210 and peripheral component(s) 1220, input devices 1235, or output devices 1240. Input/output control component 1225 may also manage peripherals not integrated into device 1205. In some cases, input/output control component 1225 may represent a physical connection or port to the external peripheral.

Input 1235 may represent a device or signal external to device 1205 that provides input to device 1205 or its components. This may include a user interface or interface with or between other devices. In some cases, input 1235 may be a peripheral that interfaces with device 1205 via peripheral component(s) 1220 or may be managed by input/output control component 1225.

Output 1240 may represent a device or signal external to device 1205 configured to receive output from device 1205 or any of its components. Examples of output 1240 may include a display, audio speakers, a printing device, another processor or printed circuit board, etc. In some cases, output 1240 may be a peripheral that interfaces with device 1205 via peripheral component(s) 1220 or may be managed by input/output control component 1225.

The components of memory controller **140-*b*, device 1205, and memory array 100-*b*** may be made up of circuitry designed to carry out their functions. This may include various circuit elements, for example, conductive lines, transistors, capacitors, inductors, resistors, amplifiers, or other active or inactive elements, configured to carry out the functions described herein.

Figure 13:
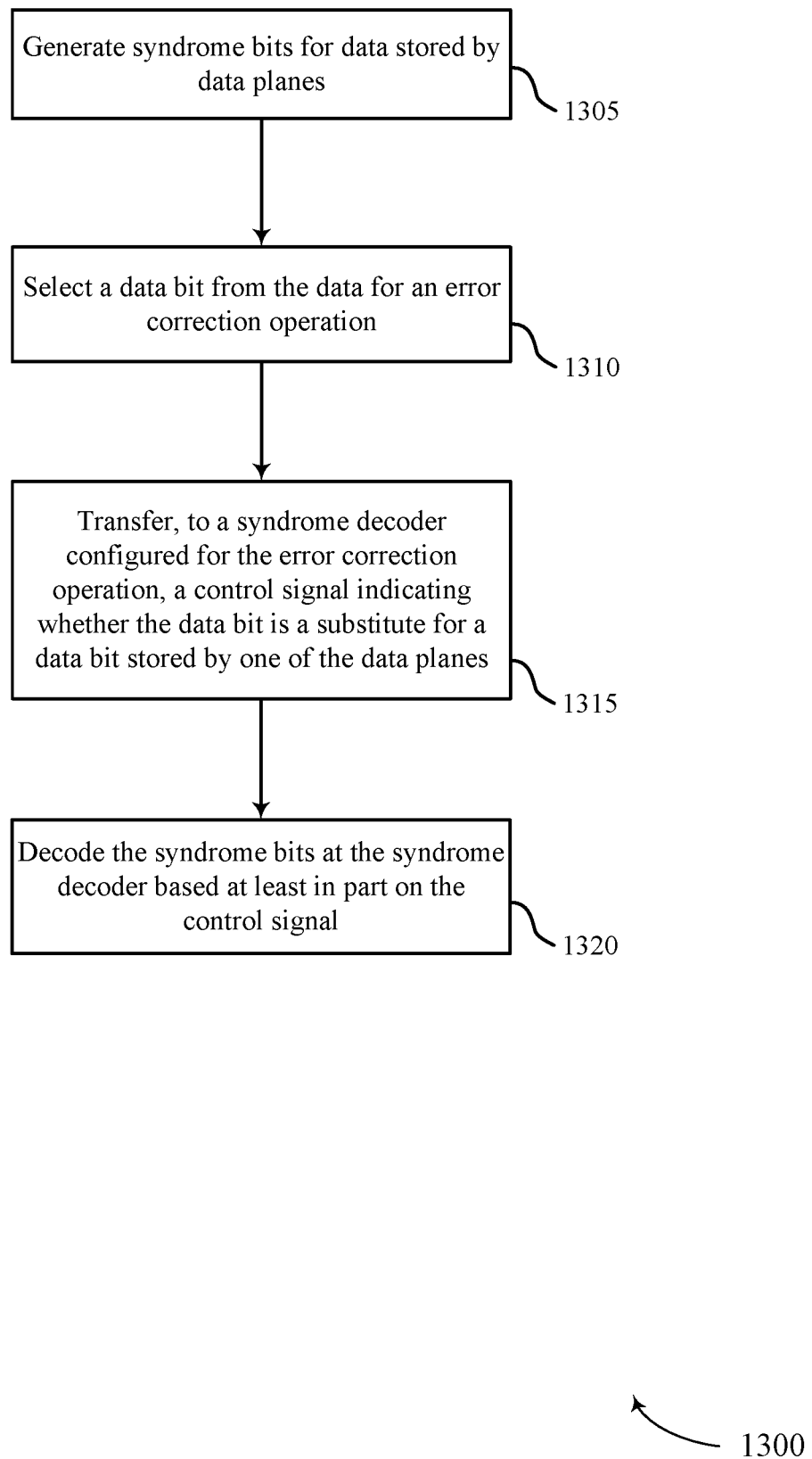
FIGS. 13 and 14 illustrate a method or methods for a direct-input redundancy scheme with adaptive decoder circuitry in accordance with various embodiments of the present disclosure.

FIG. 13 illustrates a method 1300 for a direct-input redundancy scheme with adaptive decoder circuitry in accordance with various embodiments of the present disclosure. Method 1300 may illustrate portions of a retrieval operation that includes error correction.

At block 1305, the method may include generating syndrome bits for data stored by data planes. The operations of 1305 may be performed according to the methods described with reference to FIGS. 1-10. In certain examples, the operations of 1305 may be performed by an ECC module as described with reference to FIGS. 2,8, and 10.

At block 1310, the method may include selecting a data bit from the data for an error correction operation. The operations of 1310 may be performed according to the methods described with reference to FIGS. 1-10. In certain examples, the operations of 1310 may be performed by a memory controller as described with reference to FIGS. 1 and 11.

At block 1315, the method may include transferring, to a syndrome decoder configured for the error correction operation, a control signal indicating whether the data bit is a substitute for a data bit stored by one of the data planes. In some cases, transferring the control signal includes transferring the control signal to a first decoder of the syndrome decoder. In some cases, the method may also include transferring an inverted version of the control signal to a second decoder of the syndrome decoder. The operations of 1315 may be performed according to the methods described with reference to FIGS. 1-10. In certain examples, the operations of 1315 may be performed by a memory controller as described with reference to FIGS. 1 and 11.

At block 1320, the method may include decoding the syndrome bits at the syndrome decoder based at least in part on the control signal. The operations of 1320 may be performed according to the methods described with reference to FIGS. 1-10. In certain examples, the operations of 1320 may be performed by a syndrome decoder circuit as described with reference to FIG. 10.

In some cases, the method may include transferring the data bit to a bit flipping circuit configured for the error correction operation. In such cases, the method may include activating the bit flipping circuit based at least in part on a result of decoding the syndrome bits.

In some cases, the method may include decoding the syndrome bits, when the data bit is a substitute data bit, based at least in part on inputs for the first decoder, and decoding the syndrome bits, when the data bit is not a substitute data bit, based at least in part on inputs for the second decoder.

In some cases, the method may include determining that the data bit was stored by a data plane configured to store data representing logic state that are a basis for data stored by one or more of the data planes, and detecting that the data bit is a substitute data bit based at least in part on the determination.

In some cases, portions of the method 1300 may be performed by an apparatus. The apparatus may include ECC circuits that are coupled with data planes and that are configured to receive data bits from the data planes. Each of the ECC circuits may include a set of logic gates configured to perform bitwise operations on data from the respective data plane. The apparatus may also include a redundant ECC circuit that is coupled with a redundant data plane and that is configured to receive redundant data that corresponds to data stored by at least one of the data planes. The redundant ECC circuit may include a set of logic gates configured to perform bitwise operations on the redundant data. The apparatus may also include a syndrome decoder circuit, for a first data plane of the data planes, that is coupled with the redundant ECC circuit and the ECC circuits and that is configured to adjust its output based at least in part on whether the redundant data received by the redundant ECC circuit corresponds to data stored at the first data plane.

In some cases, the output of the syndrome decoder circuit is based at least in part on a first set of inputs (e.g., the inputs for normal decoder 1030) and a second set of inputs (e.g., the inputs for redundancy decoder 1035). In such cases, the syndrome decoder circuit may be configured to adjust its output by being configured to nullify the first set of inputs when the redundant data corresponds to data stored at the first data plane and nullify the second set of inputs when the redundant data corresponds to data stored at a data plane other than the first data plane.

In some cases, the syndrome decoder circuit includes a first logic gate (e.g., logic gate 1045-*b*) and a second logic gate (e.g., logic gate 1045-*a*) that are each configured to receive syndrome-based inputs comprising syndrome bits and/or inverted syndrome bits or a combination. In such cases, the apparatus may also include an inverter that has an input coupled with the first logic gate and an output coupled with the second logic gate of the syndrome decoder circuit. The inverter may be configured to receive a signal indicating whether the redundant data corresponds to data stored at the first data plane. The syndrome decoder circuit may be configured to output an indication of whether a bit is to be inverted based at least in part on the syndrome-based inputs for the first logic gate and independent of the syndrome-based inputs for the second logic gate when the redundant data corresponds to data stored at the first data plane. The syndrome decoder circuit may be configured to output an indication of whether a bit is to be inverted based at least in part on the syndrome-based inputs for the second logic gate and independent of the syndrome-based inputs for the first logic gate when the redundant data corresponds to data stored at a data plane other than the first data plane.

In some cases, the apparatus also includes a bit flipping circuit coupled with the syndrome decoder circuit. The bit flipping circuit may be configured to invert a bit from the first data plane or the redundant data plane based at least in part on the output of the syndrome decoder circuit.

In some cases, the apparatus may include a bit flipping circuit configured to invert data bits and a syndrome decoder for a first data plane. The syndrome decoder may be coupled with the bit flipping circuit and may include a first decoder (e.g., a redundancy decoder 1035) and a second decoder (e.g., a normal decoder 1030). The first decoder may be configured to receive a first set of bits that include syndrome bits and/or inverted syndrome bits that are generated based at least in part on a set of data. The second decoder may be configured to receive a second set of bits that include inverted versions of the first set of bits. The first and second decoders may be configured to receive the first and second sets of bits, respectively, as part of a same decoding operation (e.g., a decoding operation for a same bit).

In some cases, the syndrome decoder also includes a third decoder that is configured to receive a third set of bits that includes syndrome bits and/or inverted syndrome bits. The third set of bits may be different from the first and second sets of bits and may be generated based at least in part on the set of data.

In some cases, the apparatus may include an inverter coupled with the first decoder and the second decoder. The inverter may be configured to receive a control signal indicating whether the set of data includes redundant data corresponding to data stored at the first data plane. In such cases, the first decoder may be configured to receive the control signal from a memory controller and the second decoder may be configured to receive an inverted version of the control signal from the inverter.

In some cases, the apparatus includes a data selector circuit configured to select a data bit based at least in part on the control signal. In such cases, the bit flipping circuit may be configured to invert the selected data bit based at least in part on an output of the syndrome decoder.

Figure 14:
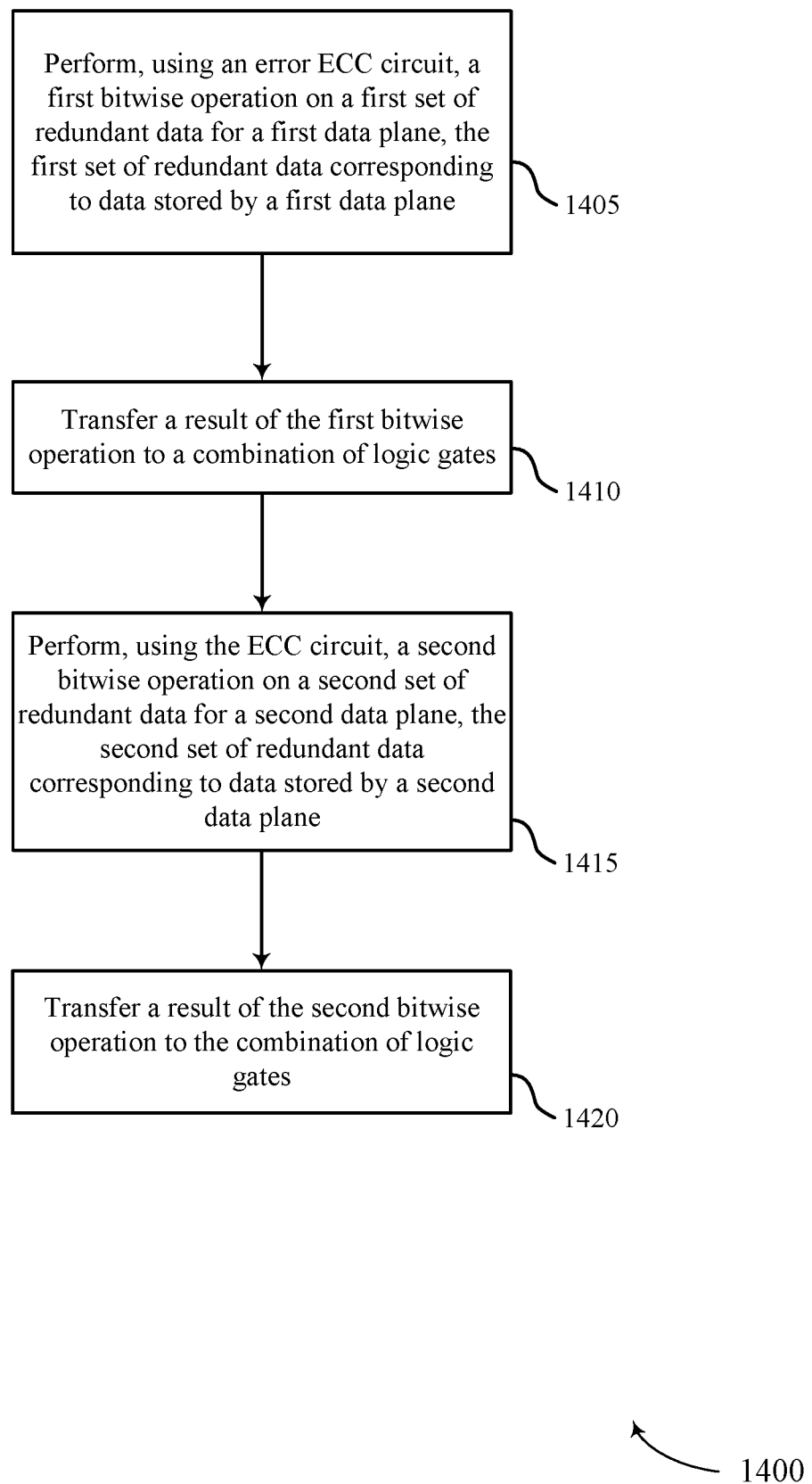

FIG. 14 illustrates a method 1400 for a direct-input redundancy scheme with adaptive decoder circuitry in accordance with various embodiments of the present disclosure. Method 1400 may illustrate portions of two retrieval operations that include error correction.

At block 1405, the method may include performing, using an ECC circuit, a first bitwise operation (e.g., an XOR operation) on a first set of redundant data for a first data plane, the first set of redundant data corresponding to data stored by a first data plane. The operations of 1405 may be performed according to the methods described with reference to FIGS. 1-10. In certain examples, the operations of 1405 may be performed by a redundant ECC circuit as described with reference to FIGS. 2, 6, 8, and 9.

At block 1410, the method may include transferring a result of the first bitwise operation (e.g., RD_ALL) to a combination of logic gates (e.g., logic gates 815-*a*, 815-*b*, and 815-*c*). Transferring the result of the first bitwise operation to the combination of logic gates may be independent of the first set of redundant data being for the first data plane. The operations of 1410 may be performed according to the methods described with reference to FIGS. 1-10. In certain examples, the operations of 1410 may be performed by a redundant ECC circuit as described with reference to FIGS. 2, 6, 8, and 9.

At block 1415, the method may include performing, using the ECC circuit, a second bitwise operation (e.g., an XOR operation) on a second set of redundant data for a second data plane, the second set of redundant data corresponding to data stored by a second data plane. The operations of 1415 may be performed according to the methods described with reference to FIGS. 1-10. In certain examples, the operations of 1415 may be performed by a redundant ECC circuit as described with reference to FIGS. 2, 6, 8, and 9.

At block 1420, the method may include transferring a result of the second bitwise operation to the combination of logic gates. Transferring the result of the second bitwise operation to the combination of logic gates may be independent of the second set of redundant data being for the second data plane. The operations of 1420 may be performed according to the methods described with reference to FIGS. 1-10. In certain examples, the operations of 1420 may be performed by a redundant ECC circuit as described with reference to FIGS. 2, 6, 8, and 9.

In some examples, the method may also include generating a first set of syndrome bits for a codeword that includes the first set of redundant data. The first set of syndrome bits may be based at least in part on the result of the first bitwise operation. In some examples, the method may also include generating a second set of syndrome bits for a second codeword that includes the second set of redundant data. The second set of syndrome bits may be based at least in part on the result of the second bitwise operation.

In some cases, the method includes performing an XOR operation on the result of the first bitwise operation (e.g., by one of logic gates 815-*a*, 815-*b*, or 815-*c*) and performing an XOR operation on the result of the second bitwise operation (e.g., by one of logic gates 815-*a*, 815-*b*, or 815-*c*).

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" or "electrically isolated" refers to a relationship between components in which electrons are not presently capable of flowing between them; components are isolated from each other if there is an open circuit between them. For example, two components physically connected by a switch may be isolated from each other when the switch is open.

As used herein, the term "substantially" means that the modified characteristic (e.g., a verb or adjective modified by the term substantially) need not be absolute but is close enough so as to achieve the advantages of the characteristic.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. An apparatus, comprising:
   error correction code (ECC) circuits coupled with data planes and configured to receive data bits from the data planes and generate first error correction information based on at least the received data bits;
   a redundant ECC circuit coupled with a redundant data plane and configured to receive, from the redundant data plane, redundant data that corresponds to data stored by at least one of the data planes and generate second error correction information based on at least in part on the redundant data; and
   a syndrome decoder circuit, for a first data plane of the data planes, that is coupled with the redundant ECC circuit and the ECC circuits and that is configured to generate an output based on at least in part on whether the redundant data received by the redundant ECC circuit corresponds to data stored by at least the first data plane, and based on at least in part on one or more of the first error correction information or the second error correction information.

2. The apparatus of claim 1, wherein the syndrome decoder circuit is configured to receive a first set of syndrome-based inputs and a second set of syndrome-based inputs, and wherein the syndrome decoder circuit is configured to generate the output by being configured to nullify the first set of syndrome-based inputs when the redundant data corresponds to data stored by the first data plane and nullify the second set of syndrome-based inputs when the redundant data corresponds to data stored by a data plane other than the first data plane.

3. The apparatus of claim 1, wherein the syndrome decoder circuit comprises a first logic gate and a second logic gate that are each configured to receive syndrome-based inputs comprising syndrome bits or inverted syndrome bits or a combination thereof and perform bitwise operations on the received syndrome-based inputs.

4. The apparatus of claim 3, further comprising:
   an inverter comprising an input coupled with the first logic gate of the syndrome decoder circuit and an output coupled with the second logic gate of the syndrome decoder circuit, the inverter configured to output, to the second logic gate, a signal indicating whether the redundant data is corresponds to data stored by the first data plane.

5. The apparatus of claim 3, wherein the output of the syndrome decoder circuit indicates whether a bit from the first data plane or the redundant data plane is to be inverted based on at least in part on the syndrome-based inputs for the first logic gate and independent of the syndrome-based inputs for the second logic gate when the redundant data is for the first data plane.

6. The apparatus of claim 3, wherein the output of the syndrome decoder circuit indicates whether a bit from the first data plane or the redundant data plane is to be inverted based on at least in part on the syndrome-based inputs for the second logic gate and independent of the syndrome-based inputs for the first logic gate when the redundant data is for a data plane other than the first data plane.

7. The apparatus of claim 1, further comprising:
   a bit flipping circuit coupled with the syndrome decoder circuit and configured to invert a bit from the first data plane or the redundant data plane based on at least in part on the output of the syndrome decoder circuit.

8. The apparatus of claim 1, wherein the redundant ECC circuit comprises a set of logic gates configured to perform bitwise operations on the redundant data, and wherein each of the ECC circuits comprises a set of logic gates configured to perform bitwise operations on data from the respective data plane.

* * * * *